(12) United States Patent
Mochizuki et al.

(10) Patent No.: US 6,190,957 B1
(45) Date of Patent: Feb. 20, 2001

(54) METHOD OF FORMING A FERROELECTRIC DEVICE

(75) Inventors: Hiroshi Mochizuki, Tokyo; Kumi Okuwada, Kawasaki; Hiroyuki Kanaya, Yokohama; Osamu Hidaka, Yokohama; Susumu Shuto, Yokohama; Iwao Kunishima, Kawasaki, all of (JP)

(73) Assignee: Kabushiki Kaisha Toshiba, Kawasaki (JP)

( * ) Notice: Under 35 U.S.C. 154(b), the term of this patent shall be extended for 0 days.

(21) Appl. No.: 09/324,501

(22) Filed: Jun. 2, 1999

(30) Foreign Application Priority Data

Jul. 9, 1996 (JP) .................................................. 8-179296
Feb. 3, 1997 (JP) .................................................. 9-020330

(51) Int. Cl.$^7$ ........................ H01L 21/8242; H01L 21/00
(52) U.S. Cl. ............................ 438/240; 438/3; 438/250; 438/253; 438/393; 438/396
(58) Field of Search .......................... 438/3, 240, 250, 438/253, 393, 396

(56) References Cited

U.S. PATENT DOCUMENTS

| | | | |
|---|---|---|---|
| 5,185,689 | 2/1993 | Maniar | 257/296 |
| 5,350,705 | * 9/1994 | Brassington et al. | 257/295 |
| 5,374,578 | * 12/1994 | Patel et al. | 438/396 |
| 5,432,732 | 7/1995 | Ohmi | 257/296 |
| 5,436,477 | 7/1995 | Hashizume | 257/295 |
| 5,466,629 | * 11/1995 | Mihara | 437/60 |
| 5,495,117 | 2/1996 | Larson | 257/298 |
| 5,534,463 | * 7/1996 | Lee et al. | 437/195 |
| 5,541,807 | 7/1996 | Evans, Jr. | 257/295 |
| 5,567,987 | 10/1996 | Lee | 257/751 |
| 5,580,814 | * 12/1996 | Larson | 438/396 |
| 5,675,185 | 10/1997 | Chen et al. | 257/774 |
| 5,686,760 | 11/1997 | Miyakawa | 257/751 |
| 5,739,563 | 4/1998 | Kawakubo et al. | 257/295 |
| 5,767,541 | 6/1998 | Hanagasaki | 257/296 |
| 5,768,182 | 6/1998 | Hu et al. | 257/296 |
| 5,834,845 | 11/1998 | Stolmeijer | 257/752 |
| 6,004,839 | * 12/1999 | Hayashi et al. | 438/210 |
| 6,008,081 | * 12/1999 | Wu | 438/210 |

FOREIGN PATENT DOCUMENTS

| | | |
|---|---|---|
| 07235639 | 9/1995 | (JP) . |
| 08111510 | 4/1996 | (JP) . |
| 08124379 | 5/1996 | (JP) . |

OTHER PUBLICATIONS

N. Tanabe, et al. A Ferroelectric Capacitor over Bit–line (F–COB), 1995 Symposium on VLSI Technology Digest of Technical Papers.

* cited by examiner

Primary Examiner—John F. Niebling
Assistant Examiner—Jennifer M. Kennedy
(74) Attorney, Agent, or Firm—Banner & Witcoff, Ltd.

(57) ABSTRACT

A method of manufacturing a semiconductor apparatus comprises the steps of forming, on a surface of a semiconductor substrate, an MIS transistor including a drain region and a source region each formed of an impurity diffusion region, forming an insulation film on the semiconductor substrate after the MIS transistor has been formed, selectively forming contact holes in the insulation film, embedding, into the contact hole, a capacitor contact plug having a lower end which is in contact with one of the drain region and the source region of the MIS transistor, forming a ferroelectric capacitor having a lower electrode, a ferroelectric film and an upper electrode on the insulation film after the capacitor contact plug has been formed, and forming an electric wire for establishing a connection between the upper electrode of the ferroelectric capacitor and an upper surface of the capacitor contact plug.

13 Claims, 20 Drawing Sheets

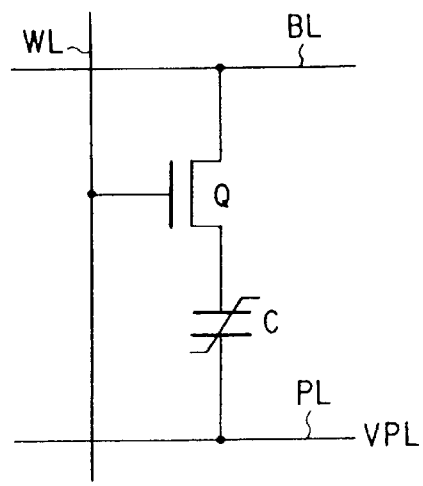
F I G. 1
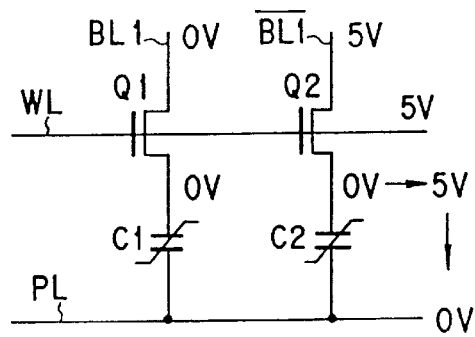
F I G. 3A
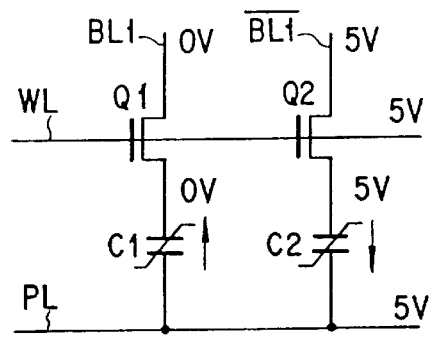
F I G. 3B
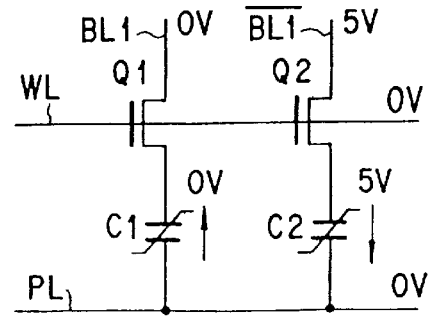
F I G. 3C

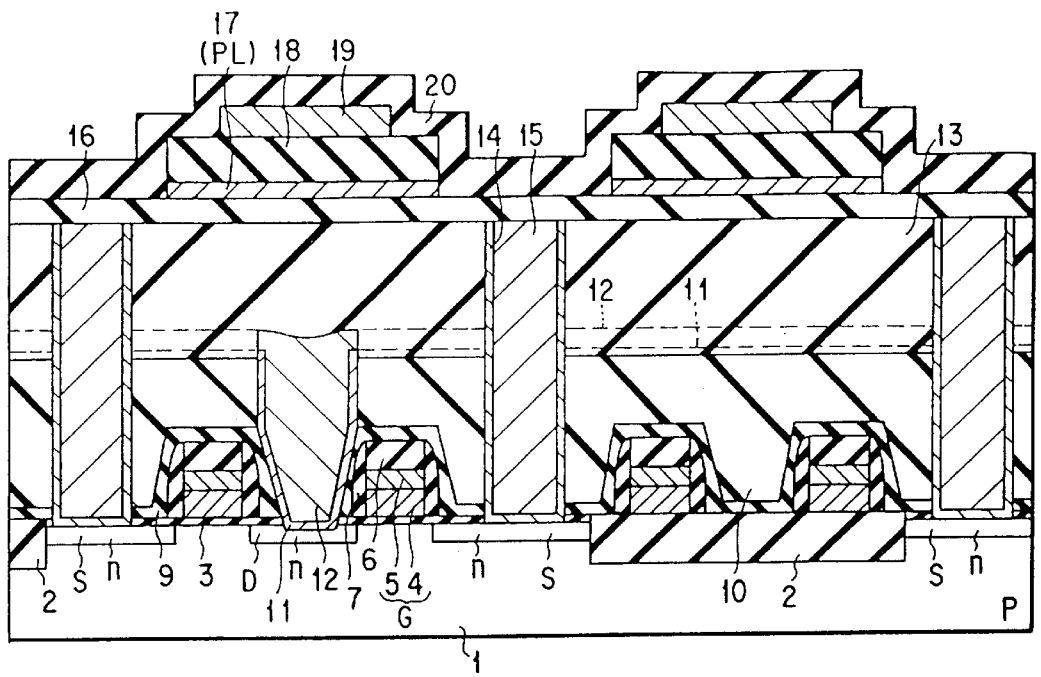
F I G. 11
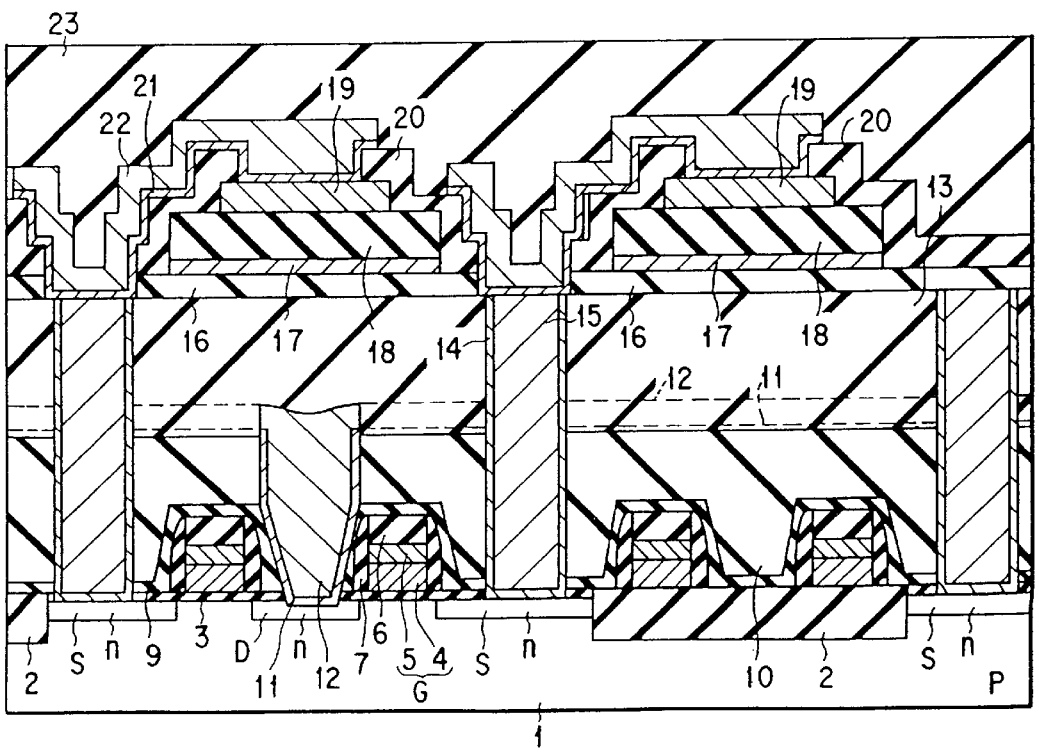
F I G. 12

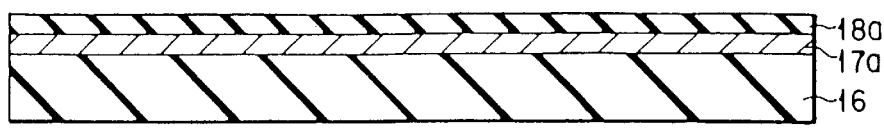
F I G. 13A
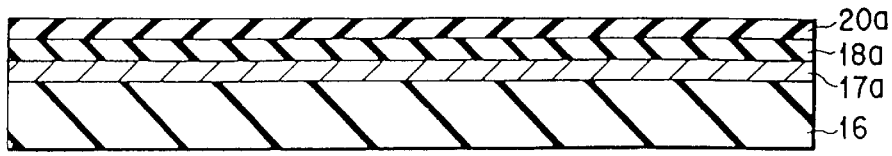
F I G. 13B
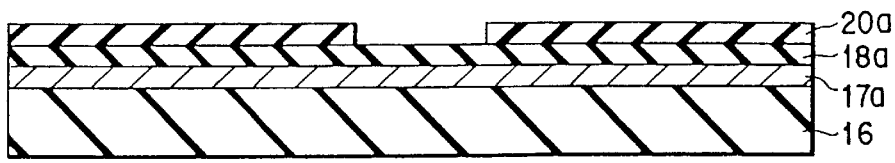
F I G. 13C
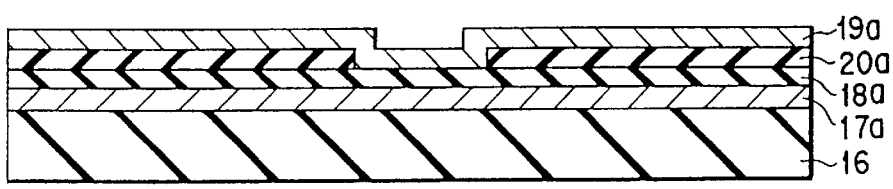
F I G. 13D
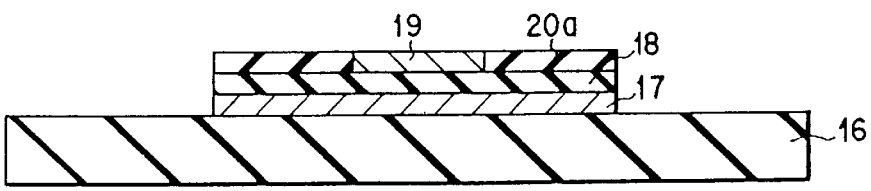
F I G. 13E
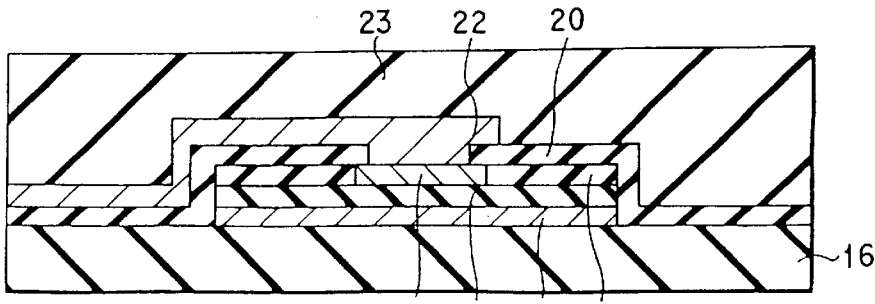
F I G. 13F

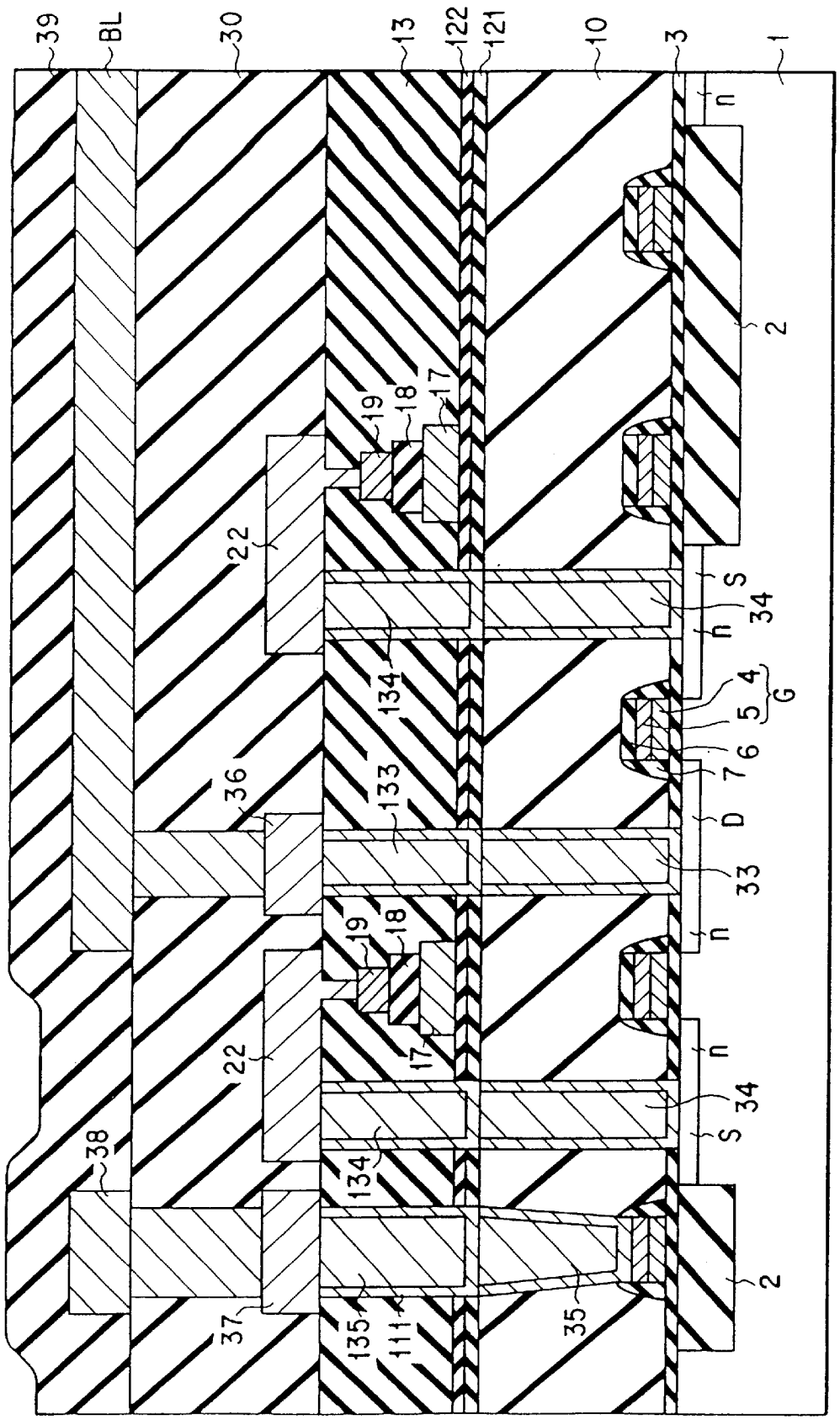
F I G. 20

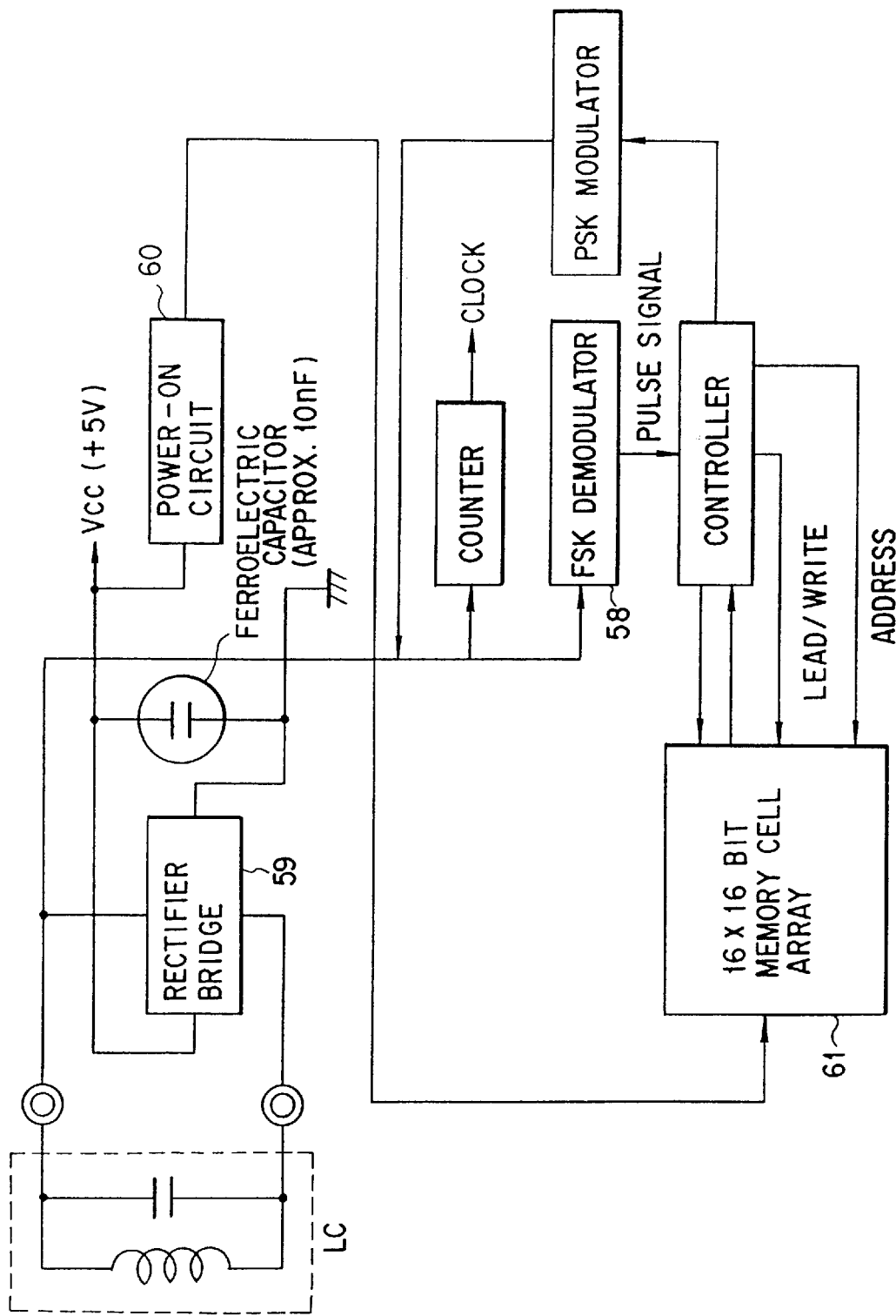
F I G. 28

METHOD OF FORMING A FERROELECTRIC DEVICE

BACKGROUND OF THE INVENTION

The present invention relates to a semiconductor apparatus having an array of memory cells each comprising complex oxides for forming an insulation film of an information storing capacitor thereof and a manufacturing method therefor, and more particularly to structures of a wiring portion for connecting a cell transistor and a cell capacitor, a contact portion of a bit line and a memory cell in a ferroelectric random access memory (FRAM) having a ferroelectric insulation film for a capacitor and a method of forming the same, and to a structure of a memory cell of a dynamic random access memory (DRAM) having an array of dynamic memory cells having a capacitor insulation film made of dielectric material and a method of forming the same.

In recent years, a non-volatile ferroelectric memory cell (a FRAM cell) and a FRAM having the foregoing memory cell array comprising, as an interelectrode insulation film of a capacitor for storing information, a ferroelectric thin film made of a material having a perovskite structure or a layered perovskite structure have attracted attention.

The ferroelectric film has a characteristic such that electric polarization generated once when an electric field has been applied is retained even if the electric field is removed and the direction of the polarization is inverted when an electric field having intensity exceeding a certain level is applied into a direction opposite to the direction of the foregoing electric field.

Taking notice of the characteristic of the dielectric material for inverting the direction of polarization, a technique has been developed to realize a FRAM cell by employing a ferroelectric material to form an insulation film of an information storing capacitor of a memory cell.

The FRAM cell has a structure in which a ferroelectric capacitor is substituted for a capacitor of a DRAM cell. The FRAM employs a method (a data destructive reading method) in which a charge in a polarization switched or non-switched state is fetched from a ferroelectric capacitor through a switching MOS transistor. Thus, the FRAM has a characteristic that data written and stored on a memory cell is not lost even if the operating power source is turned off.

The FRAM, which is the non-volatile memory, has a characteristic such that the FRAM does not require a refreshing operation to store data and no electric power is-required in a standby mode, as compared with the DRAM which is a representative large-capacity memory. When the FRAM is compared with a flash memory, which is another non-volatile memory, the FRAM has a characteristic that a great number of data rewriting times is permitted and data can significantly quickly be rewritten. When the FRAM is compared with a SRAM (Static Random Access Memory) which is used in a memory card or the like and which is needed to be backed up by a battery, the FRAM has characteristics that the electric power consumption can be reduced and the area of the cell can significantly be reduced.

The FRAM having the above-mentioned characteristics are significantly expected to be substituted for the conventional DRAM, the flash memory and the SRAM and applied to a logic circuit consolidation device and the like. Since the FRAM is able to operate at high speed without any battery, development to a non-contact ID card (RF-ID: Radio Frequency-Identification Data) has been commenced.

The structure of the memory cell in the FRAM is classified into two main types. One of the structures is arranged such that a ferroelectric film is, in place of a para-electric film, used to form a storage capacity which is as well as employed in the DRAM and which is arranged to store a charge capacity serving as information. Another structure is arranged such that a ferroelectric film is, in place of a silicon oxide film, employed to form a gate insulation film of the MOSFET. The latter structure, having no appropriate ferroelectric film which can directly be formed on a silicon layer, cannot practically be used. Since the latter structure has simply been suggested until today, the FRAM is usually the former structure.

The FRAM cell includes a 1-transistor/1-capacitor (abbreviated to 1T/1C) structure composed of one transistor Q and one ferroelectric capacitor C as shown in FIG. 1 and a 2-transistor/2-capacitor (abbreviated to 2T/2C) structure composed of two transistors Q1 and Q2 and two ferroelectric capacitors C1 and C2, for example, as shown in FIG. 3A.

Although the 1T/1C structure has an advantage in that a dense integration similarly to the DRAM is permitted, variation of the ferroelectric characteristics of the memory cells and variation of deterioration must be prevented in order to realize memory cells capable of preventing variation of their characteristics. Thus, the foregoing structure has a problem in that the manufacturing yield and the reliability as the device cannot easily be improved.

Although the 2T/2C structure has a problem in that an area which is two times the area required for the 1T/1C is required, a great characteristic margin is permitted and thus the manufacturing yield and the reliability as the device can be improved.

Both of the foregoing structures are formed such that a stacked structure of an electrode/ferroelectric member/electrode is formed on the base insulation film, Al or Cu wiring is performed through a contact hole formed in the oxide film on the stacked structure, and a passivation film is formed to serve as a protective film.

Since the FRAM cell is able to operate at high speed with small electric power consumption and a highly integrated structure is expected as described above, the reduction of the area for the memory cells and a manufacturing process which does not considerably deteriorate the ferroelectric member must be realized. Moreover, a multilayer wiring technique has not been established which is required when the conventional FRAM is consolidated with another device or when a highly integrated structure is formed.

The reason why the semiconductor integrated circuit having the FRAM device mounted thereon cannot easily be formed into a multilayered wiring structure is that the ferroelectric material has a low tolerance to a reducing atmosphere (in particular, a hydrogen atmosphere). Since the conventional LSI processes almost include a process in which hydrogen is mixed, a critical problem arises when the FRAM is manufactured.

As an example of the process in which hydrogen is mixed, a process for plugging a via hole in a multilayered wiring structure is exemplified. As a method of embedding a via hole having a large aspect ratio, a process for embedding tungsten by a CVD method is usually employed. Since the process for embedding tungsten encounters generation of a multiplicity of hydrogen groups, the ferroelectric is damaged critically.

The foregoing problem will specifically be described.

Hitherto, the ferroelectric memory cell has been formed by (1) a structure in which a bit line is formed later such that a ferroelectric capacitor is formed below the bit line; and (2) a structure in which the bit line is formed previously such that the bit line is formed below the ferroelectric capacitor.

When the ferroelectric memory cell is manufactured which has the structure in which the bit line is formed later, the ferroelectric capacitor is formed on a switching MOS transistor. Then, a lower electrode of the ferroelectric capacitor and the MOS transistor are connected to each other by a polysilicon plug, and then the bit line is formed on the ferroelectric capacitor.

When the ferroelectric capacitor is formed, the lower electrode of the ferroelectric capacitor is formed by, usually, using Pt (platinum) on the polysilicon plug, followed by forming the ferroelectric thin film. When the ferroelectric thin film is crystallized, oxidation annealing at high temperatures must be performed.

When PZT (lead-zirconate-titanate) is employed as the ferroelectric material, a defect caused from diffusion of Pb in the PZT occurring due to insufficient oxidation results in deterioration of the characteristics of the capacitor. To prevent this, sufficient oxidation must be performed in which oxidation annealing must be performed usually at 600° C. to 700° C.

When a bismuth layered compound, such as SBT (strontium-bismuth-tantalate), is employed as the ferroelectric material, the oxidation annealing must be performed at high temperatures of about 800° C.

However, the foregoing high temperature oxidation annealing encounters a problem in that the lower electrode including Pt reacts with the polysilicon plug and thus formed into silicide or the polysilicon plug is unintentionally oxidized.

When the ferroelectric memory cell having the structure in which the bit line is formed previously is manufactured, the bit line is formed on the switching transistor. Then, the ferroelectric capacitor is formed on the bit line. When the lower electrode (including, for example, Pt) of the ferroelectric capacitor and the switching transistor are, in this case, connected to each other by a polysilicon plug, there arises a problem similar to that experienced with the structure in which the bit line is formed later.

Accordingly, an upper electrode connection structure has been suggested in which an upper electrode of the ferroelectric capacitor and the switching transistor are directly connected to each other by a local electric line in the form of an embedded electric line. The foregoing structure has an advantage that the pattern layout of the ferroelectric capacitor can relatively freely be determined. When the ferroelectric capacitor is disposed on both the switching transistor region and the device isolation region, a precise structure can be realized.

The above-mentioned structure in which the bit line is formed previously and the upper electrode is connected is formed by the steps of forming the portion from the lower electrode (a plate electrode) of the ferroelectric capacitor to the upper electrode, and depositing a film for protecting the capacitor. Then, the local wiring for directly connecting the upper electrode and the switching transistor to each other is formed by opening, in the film for protecting the capacitor, a contact portion with the upper electrode and a contact portion with an active layer of the transistor. Then, the wiring film is deposited in the opening portions, followed by performing a patterning operation.

In the structure in which the bit line is formed previously and the upper electrode is connected, the operation for connecting the lower electrode (including, for example, Pt) of the ferroelectric capacitor and the switching transistor to each other by the polysilicon plug does not raise the above-mentioned problem in that the lower electrode reacts with the polysilicon plug and the same is formed into silicide. However, the aspect ratio and step coverage which are required to form a precise structure result in that the local wiring for directly connecting the upper electrode and the transistor to each other cannot easily be formed.

When the PZT or BST (barium-strontium-titanate) is employed as the ferroelectric material, the reducing atmosphere included in the CVD (Chemical Vapor Deposition) process for forming the wiring after the ferroelectric thin film has been formed raises a problem. In this case, there arises a problem in that the characteristics of the ferroelectric material deteriorate owning to the reduction reaction.

That is, when the local wiring for connecting the upper electrode and the switching transistor to each other is formed such that tungsten plug is embedded by forming a tungsten film in an intense reducing atmosphere (hydrogen type gas) in a metal CVD apparatus which has been employed to manufacture the DRAM, the characteristics (electric characteristics, such as remanant polarization) of the ferroelectric capacitor deteriorate.

Also in a case where the local wiring for connecting the upper electrode and the switching transistor to each other is formed such that a MO (Metallo-Organic) CVD is employed to form an aluminum wiring film, the characteristics of the ferroelectric capacitor deteriorate. The reason for this is that the hydrogen group components including the source materials cannot completely be removed and thus the reducing atmosphere retains.

When PZT or BST is employed as the ferroelectric material, noble metal, such as Pt, Ir, an Ir oxide ($IrO_2$), Ru, a Ru oxide ($RuO_2$), a LSCO (lanthanum-strontium-cobalt or copper-oxide) or SRO (strontium-ruthenium-oxide) or other conductive oxides can be employed.

However, the foregoing materials cannot easily precisely be processed to sub-micron level of about 0.5 $\mu$m by RIE (reactive ion etching), ion milling or ECR etching (electron cyclotron resonance etching). In particular, Pt cannot easily precisely be processed to be used to form a precise ferroelectric capacitor. However, the ferroelectric memory cell must precisely be formed to design a highly integrated ferroelectric Memory. To form a precise memory cell, it is an important fact to precisely form the upper electrode of the ferroelectric capacitor.

On the other hand, the degree of integration of the semiconductor memory has been raised year after year. Although the size has been reduced, the electric capacity of the dielectric capacitor for storing charges must be not smaller than about 30 fF. To achieve this, the effective area of the capacitor must be enlarged, the thickness of the dielectric film must be reduced or the dielectric constant of dielectric material must be raised. The conventional technique for DRAM has been attempted to stereoscopically form the capacitor and reduce the thickness of the same by mainly improving the two former factors. However, the stereoscopically forming the capacitor by the conventional $SiO_2$ type dielectric film and reducing the thickness of the film have limitations. Therefore, a technique for depositing a thin film of a dielectric material having a high dielectric constant has been required.

When a capacitor having the stacked structure of the electrode/the ferroelectric material/the electrode which is employed in the FRAM or the that having the stacked structure of the electrode/the dielectric material having a higher dielectric constant/the electrode which is employed in the DRAM is manufactured, the noble metal, such as Pt, Ir, Ru, $IrO_2$, $RuO_2$, LSCO or SRO or the conductive oxides are, as described above, employed as the material of the electrode.

As the ferroelectric material for the FRAM cell capacitor, an oxide including perovskite structure, such as PZT (Pb (Zr, Ti) $O_3$), SBT ($SrBi_2(Ta, Nb)_2$) or BIT ($Bi_4Ti_3O_{12}$) or an oxide in the form in which a substitutional element is substituted for a portion of each of the foregoing oxides is employed. As the dielectric material of the DRAM cell capacitor, BST ((Ba, Sr) $TiO_3$) or the like is employed.

As a method of forming the ferroelectric film or the dielectric film, a spin coating method, such as sputtering, laser ablation, CVD, MOD (Metallo-Organic Decomposition) or sol-gel method or a LSMCD (Liquid Source Misted Chemical Deposition) method in which a mist MOD material is guided to an upper surface of a wafer by a carrier gas to deposit the material while using ultraviolet rays for assistance are known.

The sputtering method is a film forming method with which mass production can satisfactorily be performed. Since two electrodes (made of metal or a conductive oxide) on both sides of the dielectric material can be formed by the same sputtering method, the throughput can easily be improved.

Since the sputtering method and the laser ablation method are methods each having the step of forming the film in an atmospheric gas of $N_2$, Ar, Ar/$O_2$ or the like, unintentional introduction of the components of the gas into the film cannot be prevented during the film forming process. Thus, voids are, due to the retained gas, formed in a complex oxide film (an oxide film containing at least two or more types of metal elements). As a result, there arises a problem in that a dense oxide film cannot be formed.

In actual, a sputter gas of Ar or the like is detected from the film immediate after the deposition process. The above-mentioned methods have the step of guiding gas molecules near the target with large energy of plasma so as to be made incident upon the film. Since the foregoing mechanism is different from diffusion or the like, large energy is retained and residual gas can easily be implanted into the film as the sputtering pressure is low. Since the film immediate after the deposition is an amorphous film or a crystal film having a low density, the residual gas can be dispersed and thus the gas is inconspicuous. However, if the film is subjected to a heat treatment for crystallization, the residual gas is left in the grain boundary and/or the interface of the crystal and thus apparent voids are formed.

If the heat treatment is performed in a short time, large voids are formed in the grains as well as in the grain boundary and the interface. Since also the film forming process, such as the CVD or the LSMCD, uses a carrier gas for introducing the raw material into the chamber, the carrier gas is introduced into the film. Thus, voids are formed in the comp lex oxide film attributable to the residual gas, similarly to the sputtering process.

The size of the void is determined when the annealing process is performed after the film forming process to crystallize the film or to raise the density. If the annealing operation is a rapid thermal processing in which the rate at which the temperature is raised is high, apparent voids are formed. That is, the crystallizing annealing operation of the complex oxide film, required to perform the rapid thermal processing in order to minimize diffusion and evaporation, encounters a problem in that a dense film cannot be formed because of the above-mentioned problems.

However, a ferroelectric film having a low film density suffers from reduction of the polarization quantity and thus a satisfactory operating margin cannot be realized. Moreover, it cannot be operated with low voltages. What is worse, short circuit easily occurs when a thin film is formed. There arises another problem in that the characteristics are excessively changed attributable to the atmosphere in the post process. If voids are formed in also the electrode film because of the same reasons and thus the density of the film is lowered, the resistance of the film is raised and thus a problem arises in that the operation speed is lowered.

As described above, the conventional ferroelectric memory cannot easily prevent deterioration of the characteristics of the ferroelectric capacitor and integrate the manufacturing process.

BRIEF SUMMARY OF THE INVENTION

An object of the present invention is to provide a method of manufacturing a semiconductor apparatus capable of preventing deterioration in the characteristics of a ferroelectric capacitor and enabling process integration when a ferroelectric memory cell is manufactured, and a semiconductor apparatus manufactured by the method according to the present invention.

Another object of the present invention is to provide a method of manufacturing a semiconductor apparatus enabling a ferroelectric memory having a multilayered wiring structure composed of at least two layers to be manufactured such that bit lines to be connected to the cells can be formed by multilayered wiring and permitting dense integration and consolidation with another device to be realized, and a semiconductor apparatus manufactured by the manufacturing method according to the present invention.

Another object of the present invention is to provide a method of manufacturing a semiconductor apparatus enabling a ferroelectric memory having a multilayered wiring structure composed of at least two layers to be manufactured such that via holes required to form the multilayered wiring can be plugged without damage of the ferroelectric capacitor, and a semiconductor apparatus manufactured by the manufacturing method according to the present invention.

Another object of the present invention is to provide a method of manufacturing a semiconductor apparatus capable of manufacturing a FRAM cell having a ferroelectric member to form an insulation film for an information storing capacitor thereof or a DRAM cell containing a dielectric material having a high dielectric constant such that a precise and reliable ferroelectric film and a dielectric film having a high dielectric constant can be formed.

According to one aspect of the present invention, there is provided a method of manufacturing a semiconductor apparatus comprising the steps of:

forming, on a surface layer portion of a semiconductor substrate, an MIS transistor including a drain region and a source region each formed of an impurity diffusion region;

forming an insulation film on the semiconductor substrate after the MIS transistor has been formed;

selectively forming a contact hole in the insulation film;

embedding, into the contact hole, a capacitor contact plug having a lower end which is in contact with one of the drain region and the source region of the MIS transistor;

forming a ferroelectric capacitor having a lower electrode, a ferroelectric film and an upper electrode above the insulation film after the capacitor contact plug has been formed; and forming an electric wire for establishing a connection between the upper electrode of the ferroelectric capacitor and an upper surface of the capacitor contact plug.

According to a second aspect of the present invention, there is provided a method of manufacturing a semiconductor apparatus comprising the steps of:

forming an MIS transistor composed of a drain region and a source region each formed of an impurity diffusion region and formed on a surface layer portion of a semiconductor substrate;

forming a first insulation film on the semiconductor substrate after the MIS transistor has been formed;

forming, in the first insulation film, a first contact hole for exposing one of the drain region and the source region of the MIS transistor;

forming, on the first insulation film, a bit line having a lower end which is in contact with the one of the drain region and the source region of the MIS transistor through the first contact hole;

forming, in the first insulation film, a second contact hole for exposing the other one of the drain region and the source region of the MIS transistor;

embedding, into the second contact hole, a first capacitor contact plug having a lower end which is in contact with the other one of the drain region and the source region of the MIS transistor;

forming a second insulation film on the first insulation film and the bit line;

forming a third contact hole at a position above the second contact hole in the second insulation film;

embedding, into the third contact hole, a second capacitor contact plug having a lower end which is in contact with a top end of the first capacitor contact plug;

forming a ferroelectric capacitor having a lower electrode, a ferroelectric film and an upper electrode above the second insulation film after the second capacitor contact plug has been formed; and forming an electric wire for establishing a connection between the upper electrode of the ferroelectric capacitor and a top end of the second capacitor contact plug.

A structure may be employed in which the step of embedding the third contact hole and the step of embedding the second contact hole are integrally performed, and the step of forming the first capacitor contact plug and the step of forming the second capacitor contact plug are continuously and integrally performed.

A structure may be employed which further comprises the steps of: depositing a third insulation film on the second insulation film between the step of embedding the second capacitor contact plug and the step of forming the ferroelectric capacitor; and forming a fourth contact hole in the third insulation film for connecting the electric wire between the step of forming the ferroelectric capacitor and the step of forming the electric wire.

It is preferable to further comprises a step of sintering using at least one of a hydrogen-based gas and a nitrogen-based gas between the step of embedding the second capacitor contact plug and the step of forming the ferroelectric capacitor.

It is preferable that the step of forming the ferroelectric capacitor includes a step of depositing a fourth insulation film on the ferroelectric film after the lower electrode and the ferroelectric film have been deposited, a step of selectively forming an opening portion in the fourth insulation film, a step of depositing an electrode material for the upper electrode on the fourth insulation film and in the opening portion, and a step of removing the electrode material on the fourth insulation film to form the upper electrode.

It is preferable that the step of embedding the second capacitor contact plug includes, after a refractory metal has been deposited on the second insulation film and in the third contact hole, a step of removing the refractory metal on the second insulation film.

According to a third aspect of the present invention, there is provided a semiconductor apparatus comprising:

an MIS transistor having a drain region and a source region each of which is formed of an impurity diffusion region and formed on a surface of a semiconductor substrate;

an insulation film formed on the semiconductor substrate including the MIS transistor:

a capacitor contact plug embedded in the insulation film and having a lower end which is in contact with one of the drain region and the source region;

a ferroelectric capacitor formed above the first insulation film and having a lower electrode, an interelectrode ferroelectric film and an upper electrode; and an electric wire for establishing a connection between a top end of the capacitor contact plug and the upper electrode of the ferroelectric capacitor.

According to a fourth aspect of the present invention, there is provided a semiconductor apparatus comprising:

an MIS transistor having a drain region, a source region and a gate electrode, the drain region and the source region each being formed of an impurity diffusion region and formed on a surface of a semiconductor substrate;

a first insulation film formed on the semiconductor substrate including the MIS transistor:

a bit line contact plug embedded in the first insulation film;

a bit line connected to one of the drain region and the source region through the bit line contact plug and formed on the first insulation film;

a first capacitor contact plug embedded in the first insulation film and having a lower end which is in contact with the other one of the drain region and the source region;

a second insulation film formed above the semiconductor substrate including the bit line;

a second capacitor contact plug embedded in the second insulation film and having a lower end which is in contact with a top end of the first capacitor contact plug;

a ferroelectric capacitor formed above the second insulation film and having a lower electrode, an interelectrode ferroelectric film and an upper electrode; and an electric wire for establishing a connection between a top end of the second capacitor contact plug and the upper electrode of the ferroelectric capacitor.

A structure may be employed in which the first capacitor contact plug and the second capacitor contact plug are formed integrally.

It is preferable to further comprise a third insulation film formed above the second capacitor contact plug and below the ferroelectric capacitor, wherein the electric wire, through a contact hole formed in the third insulation film, establishes a connection between the top end of the second capacitor contact plug and the upper electrode of the ferroelectric capacitor.

It is preferable that a material of the second capacitor contact plug is a refractory metal and a material of the electric wire is at least one material selected from a group consisting of an aluminum-based material, a copper-based material and a polysilicon-based material.

It is preferable that an area of a lower surface of the electric wire is larger than an area of the top end of the second capacitor contact plug, and the lower surface of the electric wire is in contact with the top end of the second capacitor contact plug and the second insulation film.

It is preferable that the upper electrode of the ferroelectric capacitor is embedded in an opening portion formed in a fourth insulation film deposited on the interelectrode ferroelectric film of the ferroelectric capacitor.

According to a fifth aspect of the present invention, there is provided a method of manufacturing a semiconductor apparatus comprising the steps of:

forming an MIS transistor including a drain region and a source region each formed of an impurity diffusion region and formed on a surface of a semiconductor substrate;

forming a first insulation film on the semiconductor substrate having the MIS transistor formed thereon;

forming, in the first insulation film, first contact holes for exposing the drain region and the source region;

embedding, in the first contact hole, a bit line contact plug having a lower end which is in contact with one of the drain region and the source region of the MIS transistor and a capacitor contact plug having a lower end which is in contact with the other one of the drain region and the-source region of the MIS transistor;

forming, above the first insulation film in which the bit line contact plug and the capacitor contact plug are embedded, a ferroelectric capacitor having a lower electrode, an interelectrode ferroelectric film and an upper electrode;

forming, above the first insulation film having the ferroelectric capacitor formed thereabove, a second insulation film;

selectively forming second contact holes in the second insulation film;

forming, on the second insulation film and in the second contact holes, a capacitor electric wire for establishing a connection between the upper electrode of the ferroelectric capacitor and a top end of the capacitor contact plug, and a bit line contact plug electric wire connected to a top surface of the bit line contact plug;

forming a third insulation film on the second insulation film including the capacitor electric wire and the bit line contact plug electric wire;

forming a via hole in a portion corresponding to a portion above the bit line contact plug electric wire of the third insulation film; and depositing a conductive material for forming a bit line on the third insulation film and in the via hole and then patterning the material to form a bit line on the third insulation film.

It is preferable to further comprise the step of depositing a fourth insulation film on the first insulation film between the step of embedding the capacitor contact plug and the step of forming the ferroelectric capacitor; and the step of forming, in the fourth insulation film, third contact holes for connecting the electric wire between the step of forming the ferroelectric capacitor and the step of forming the capacitor electric wire and the bit line capacitor contact plug electric wire.

It is preferable to further comprise the step of sintering, using at least one of a hydrogen-based gas or a nitrogen-based gas between the step of embedding the capacitor contact plug and the step of forming the ferroelectric capacitor.

It is preferable that the step of forming the ferroelectric capacitor includes a step of depositing a fifth insulation film on the interelectrode ferroelectric film after the lower electrode film and the interelectrode ferroelectric film have been deposited, a step of selectively forming an opening portion in the fifth insulation film and a step of forming the upper electrode, after an electrode material for forming the upper electrode has been deposited in the opening portion and on the fifth insulation film, by removing the electrode material on the fifth insulation film.

According to a sixth aspect of the present invention, there is provided a method of manufacturing a semiconductor apparatus comprising the steps of:

forming a capacitor including a ferroelectric film having a perovskite structure or a layered perovskite structure above a semiconductor substrate;

forming a multilayered wiring structure including a lower wiring layer, an upper wiring layer and an interlayer insulating layer interposed between the lower wiring layer and the upper wiring layer;

opening a through hole in the interlayer insulating layer; and reflowing at least one material selected from a group consisting of Al, AlCu, AlCuSi, $WSi_2$, and Cu to embed the through hole therewith, after the step of forming the capacitor.

The step of reflowing the at least one material may include a step of embedding the through hole with. the at least one material to connect the lower wiring layer to the upper wiring layer.

According to a seventh aspect of the present invention, there is provided a semiconductor apparatus comprising:

an MIS transistor having a drain region and a source region each of which is formed of an impurity diffusion region and formed on a surface of a semiconductor substrate;

a first insulation film formed on the semiconductor substrate including the MIS transistor;

a bit line contact plug embedded in the first insulation film and having a lower end which is in contact with one of the drain region and the source region;

a capacitor contact plug embedded in the first insulation film and having a lower end which is in contact with the other one of the drain region and the source region;

a ferroelectric capacitor formed above the first insulation film and having a lower electrode, an interelectrode ferroelectric film and an upper electrode;

a second insulation film formed above the ferroelectric capacitor and the first insulation film;

a capacitor electric wire formed on the second insulation film for establishing a connection between the upper electrode of the ferroelectric capacitor and a top surface of the capacitor contact plug through a first contact hole selectively formed in the second insulation film;

a bit line contact plug electric wire formed on the second insulation film and connected to a top surface of the bit line contact plug through a second contact hole selectively formed in the second insulation film;

a third insulation film formed on the second insulation film including the capacitor electric wire and the bit line contact plug electric wire; and a bit line formed on the third insulation film and connected to the bit line contact plug electric wire through a via hole selectively formed in the third insulation film.

According to an eighth aspect of the present invention, there is provided a semiconductor apparatus comprising:

a switching transistor formed on a semiconductor substrate;

a first insulation film for covering the semiconductor substrate having the transistor formed thereon and having a flattened surface;

a first bit line contact plug embedded in the first insulation film and connected to the first transistor;

a ferroelectric capacitor composed of a lower electrode, an interelectrode ferroelectric film and an upper electrode sequentially formed on the surface of the first insulation film;

a second insulation film covering the lower electrode, the interelectrode ferroelectric film and the upper electrode and having a flattened surface; and a second bit line contact plug formed by reflowing at least one material selected from a group consisting of Al, AlCu, AlCuSi, WSi$_2$ and Cu to plug a via hole selectively formed in the second insulation film and connected to the first bit line contact plug.

It is preferable to further comprise an upper electrode outlet electric wire formed on the upper electrode and connected to the upper electrode, wherein any one of a W metal layer, a TiN metal layer and a Ti metal layer is selectively formed on an upper surface of the upper electrode outlet electric wire.

It is preferable that any one of the W metal layer, a TiN metal layer and a Ti metal layer selectively formed on the upper electrode outlet electric wire is formed by a sputtering method.

It is preferable that the upper electrode outlet electric wire contains at least one material selected from a group consisting of Al, AlCuSi, AlCu, W, TiN and Ti.

It is preferable to further comprise:

a third insulation film formed above the second insulation film and having a flattened surface; and a third bit line contact plug embedded in the third insulation film and having a lower end which is in contact with a top end of the second bit line contact plug, wherein the third bit line contact plug is formed by reflowing at least one material selected from a group consisting of Al, AlCu, AlCuSi, WSi$_2$ and Cu, to embed a first contact-hole selectively formed in the third insulation layer.

A semiconductor apparatus may further comprise:

an upper electrode outlet electric wire formed between the second insulation film and the third insulation film and connected to the upper electrode through a second contact hole selectively formed in the second insulation film; and a first layer electric wire formed by the same wiring layer as the upper electrode outlet electric wire between the second insulation layer and the third insulation layer.

According to a ninth aspect of the present invention, there is provided a method of manufacturing a semiconductor apparatus comprising the steps of:

forming a first electrode layer above a semiconductor substrate;

forming, on the first electrode layer, a dielectric film made of a complex oxide film containing at least two types of metal elements;

forming a second electrode layer on the dielectric film; and performing a rapid thermal processing such that an ambient pressure is lowered to 0.5×133.322 Pa or higher and 500×133.322 Pa or lower and a temperature raising rate is 10° C./second or higher, at a sequence selected from (1) between the step of forming the first electrode layer and the step of forming the dielectric film, (2) between the step of forming the dielectric film and the step of forming the second electrode layer and (3) after the step of forming the second electrode layer.

It is preferable that the step of performing the rapid thermal processing under the lowered pressure is performed under anyone of (1) oxygen partial pressure of 0.5×133.322 Pa or higher and 500×133.322 Pa or higher, (2) ozone partial pressure of 0.5×133.322 Pa or higher and 500×133.322 Pa or higher, and (3) an ozone partial pressure ratio of 1% or higher.

According to the method of manufacturing a semiconductor apparatus according to the present invention, the ferroelectric capacitor memory cell can be formed such that the contact plug layer is embedded on either source/drain region of the switching transistor, and the ferroelectric capacitor is formed and the capacitor upper electrode and the top end of the contact plug are connected to each other by an electric wire. Thus, an influence of a process, which is performed in a reducing atmosphere after the ferroelectric capacitor has been formed, can be eliminated. Moreover, the ferroelectric capacitor can easily be formed.

The method of manufacturing a semiconductor apparatus according to the present invention is able to precisely process the capacitor upper electrode (made of Pt or the like). Thus, the pattern of the ferroelectric memory cell can be formed precisely.

Therefore, according to the semiconductor apparatus manufactured by the method of manufacturing a semiconductor apparatus according to the present invention, a structure can be provided in which the electric wire for establishing the connection between the capacitor upper electrode and the top end of the contact plug has satisfactory reliability and the ferroelectric capacitor can precisely be formed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, servo to explain the principles of the invention.

FIG. 1 is a circuit diagram showing a structure equivalent to a general ferroelectric memory cell having a 1-transistor and 1-capacitor structure;

FIGS. 3A–3C are diagrams showing a principle of a writing operation of a general ferroelectric memory cell of a 2-transistor and 2-capacitor type having two memory cells shown in FIG. 1;

FIGS. 9–12 are schematic cross sectional views each showing a portion of a cell array for sequentially showing manufacturing steps of the ferroelectric memory cell array according to the first embodiment of the present invention;

FIGS. 13A–13F are cross sectional views sequentially showing a modification of the manufacturing process for the ferroelectric capacitor shown in FIGS. 11 and 12;

FIG. 20 is a cross sectional view of the FRAM cell for illustrating a method of manufacturing the FRAM cell array according to a fourth embodiment of the present invention;

FIG. 28 is a block diagram showing the detailed structure of the internal circuit of the RF-ID chip.

DETAILED DESCRIPTION OF THE INVENTION

Prior to describing embodiments of the present invention, a FRAM which is an example of a semiconductor apparatus to which the present invention is applied will briefly be described.

FIG. 1 shows a circuit equivalent to a usual ferroelectric memory cell of a 1-transistor/1-capacitor type. Referring to FIG. 1, symbol C represents a ferroelectric capacitor, Q represents a charge transferring MOS transistor, WL represents a word line connected to the gate of the MOS transistor, BL represents a bit line connected to an end of a source/drain of the MOS transistor, PL represents a plate line connected to an electrode (a plate electrode) of the capacitor and VPL represents voltage of the plate line.

Figure 2:
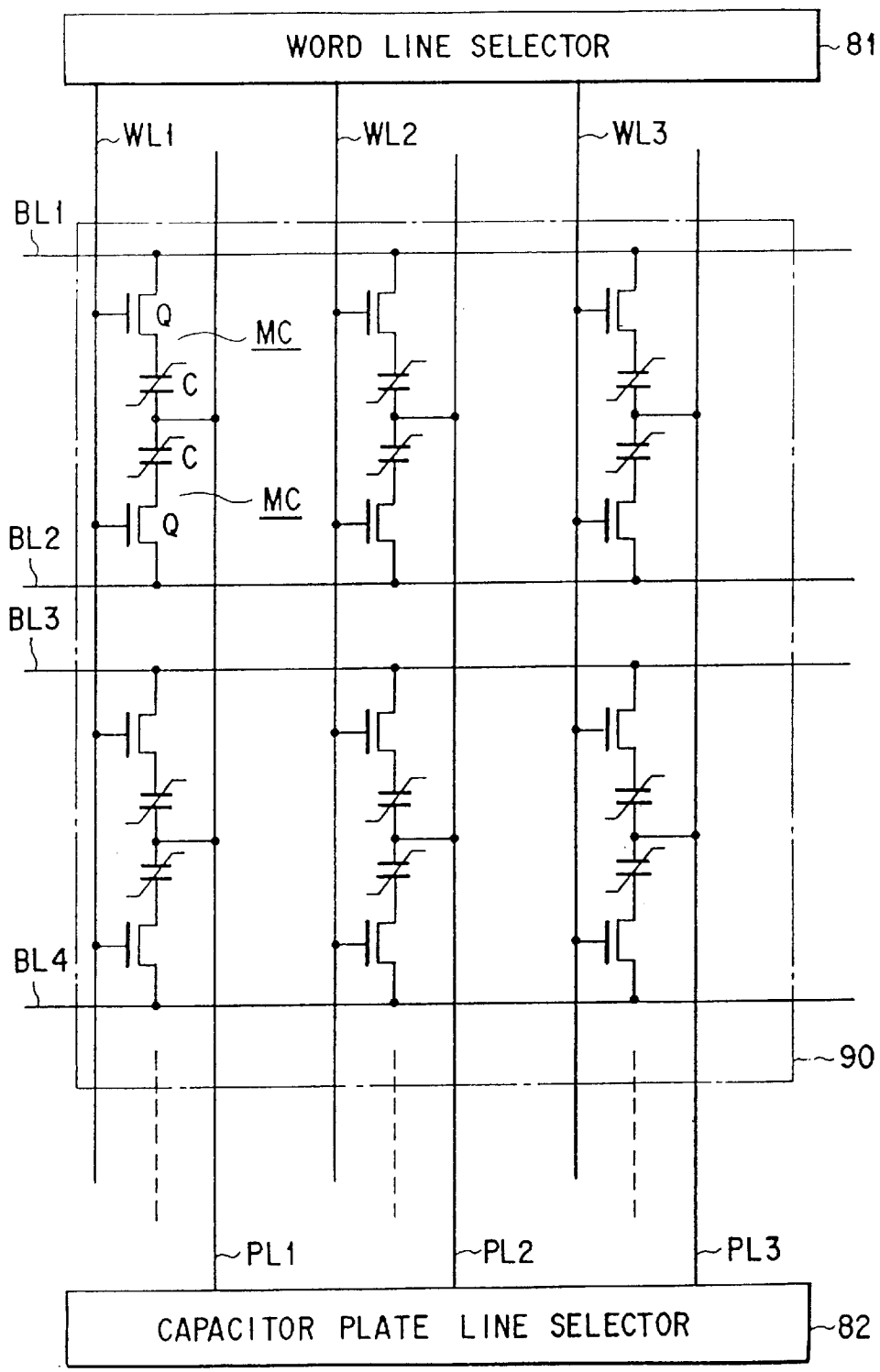
FIG. 2 is a circuit diagram showing a structure equivalent to a structure having a memory cell composed of the ferroelectric memory cell shown in FIG. 1 and a portion of its peripheral circuit.

FIG. 2 shows a portion of an equivalent circuit of the ferroelectric memory cell array having a folded bit line structure.

Referring to FIG. 2, symbol MC represents a unit cell formed by, in series, connecting an information storing ferroelectric capacitor C having an interelectrode insulation film made of a ferroelectric material and a charge transferring MOS transistor (the switching transistor) Q to each other. The unit cells MC are disposed in rows and columns so that a memory cell array 90 is formed.

WLi (i=1, 2, 3, . . . ) represents a plurality of word lines commonly connected to the gates of transistors Q in the unit cells on the same row in the cell array 90.

PLi (i=1, 2, 3, . . . ) represents a plurality of plate lines commonly connected to plate electrodes of the capacitors C in the unit cells on the same row in the cell array 90.

BLi (i=1, 2, 3, 4, . . . ) represents a bit line commonly connected to either the source or the drain (for example, the drain) of the transistors in the unit cells on the same row in the cell array 90.

A word line selector 81 selects a portion of the plural word lines WLi in accordance with an address signal to apply a word line voltage.

A capacitor plate line selector 82 selects a portion of the plural plate lines PLi in accordance with the address signal to control the voltage of the selected plate line PLi.

On the other hand, the ferroelectric memory cell of the 2-transistor/2-capacitor type comprising the two memory cells each shown in FIG. 1 is, for example, as shown in FIG. 3A, composed of first and second transistors Q1 and Q2 and first and second capacitors C1 and C2, in series, connected to correspond to the first and second transistors Q1 and Q2.

First and second bit lines BL1 and /BL1 are connected to correspond to the respective drains of the first and second transistors Q1 and Q2. Moreover, a word line WL is commonly connected the respective gates. In addition, a plate line PL is connected commonly to the plates of the first and second capacitors C1 and C2.

The word line WL and the plate line PL are disposed in parallel to each other so that a word line signal is supplied to a word line WL selected by a row decoder (not shown) for the word line. Moreover, plate line voltage VPL is applied to a plate line PL selected by a row decoder (not shown) for the plate line.

A sense amplifier (not shown) for amplifying the potential of the bit line, a writing circuit (not shown) and a precharge circuit (not shown) are connected to the two bit lines BL1 and /BL1.

The principles of the operation for writing data on the ferroelectric memory cell having the 2-transistor/2-capacitor structure and the operation for reading data from the same will now be described with reference to FIGS. 3A–3C, FIGS. 4A–4C and FIG. 5.

When data is written on the ferroelectric memory cell or data is read from the same, the potential of the plate line PL of the selected memory cell is sequentially changed as, for example, 0V, 5V and 0V, the direction of the polarization can be controlled.

(A) Writing of Data

In an initial state of the data writing operation, the plate line PL is set to be ground potential Vss (0V), while the two bit lines BL1 and /BL1 are precharged to 0V.

Initially, either bit line BL1 or the bit line /BL1 (for example, the second bit line /BL1) is set to be, for example, 5V, as shown in FIG. 3A, while 5V is applied to the word line WL. As a result, the two transistors Q1 and Q2 are turned on so that the potentials at the two electrodes of the second capacitor C2 are made to be different from each other. Thus, polarization indicated by a downward arrow is generated. However, no polarization is generated in the first capacitor C1.

Then, the plate line PL is set to be 5V as shown in FIG. 3B so that the potentials at the two electrodes of the first capacitor C1 are made to be different from each other. Thus, polarization indicated by an upward arrow is generated. However, the polarization of the second capacitor C2 is not inverted. As a result, a state is realized in which opposite polarizations are generated in the two capacitors C1 and C2 as illustrated, the realized state corresponding to a state of writing data "1" or "0".

Then, the plate line PL is set to be 0V, as shown in FIG. 3C, while the word line WL is set to be 0V. Thus, the transistors Q1 and Q2 are turned off. As a result, the above-mentioned writing state is retained.

(B) Reading of Data

Figure 4A:
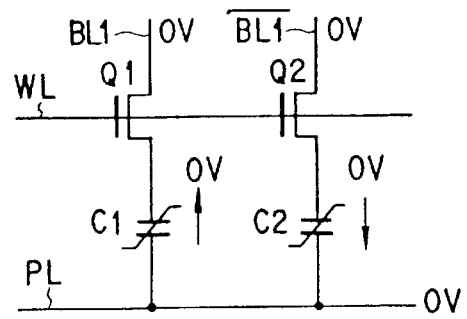
FIGS. 4A–4C are diagrams showing a principle of a reading operation of the ferroelectric memory cell which is the same as that shown in FIGS. 3A–3C.

In the initial state of the data reading operation, the plate line PL is set to be 0V, and the two bit lines BL1 and /BL1 are precharged to 0V. An assumption is performed that data in a state where opposite polarizations have been generated in the two capacitors C1 and C2 as shown in FIG. 4A has been written.

Figure 4B:
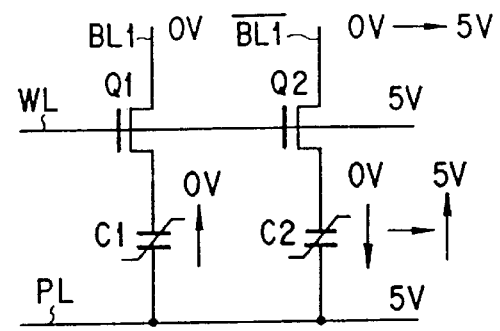

Initially, the plate line PL is set to be 5V as shown in FIG. 4B, while, for example, 5V is applied to the word line WL so that the two transistors Q1 and Q2 are turned on. Thus, the potentials at the two electrodes of the second capacitor C2 are made to be different from each other so that the direction of the polarization of the second capacitor C2 is inverted. However, the direction of the polarization of the first capacitor C1 is not inverted. The reading potentials from the two capacitors C1 and C2 are sense-amplified by a sense amplifier connected to the bit line. The output from the sense amplifier causes the two bit lines BL1 and /BL1 to be set to be 0V and 5V. That is, in accordance with the output from the sense amplifier, whether read data is "1" or "0" is determined.

Figure 4C:
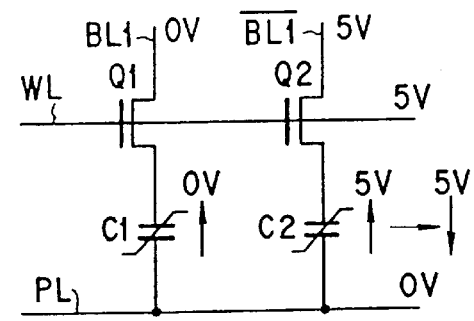
Figure 5:
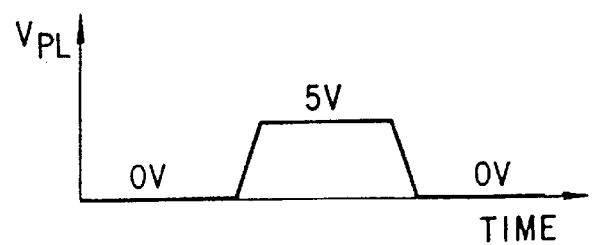
FIG. 5 is a waveform graph showing an example of voltage waveform which is applied to a plate line PL when the writing operation shown in FIGS. 3A–3C and the reading operation shown in FIGS. 4A–4C are performed.

Then, the plate line PL is set to be 0V, as shown in FIG. 4C so that the potentials at the two electrodes of the second capacitor C2 are made to be different from each other. Thus, the direction of the polarization of the second capacitor C2 is inverted. However, the direction of the first capacitor C1 is not inverted. Thus, the direction of the polarization is returned to the initial state.

An embodiment in which the manufacturing method according to the present invention is applied to the above-mentioned FRAM will now be described.

First Embodiment

Figure 6:
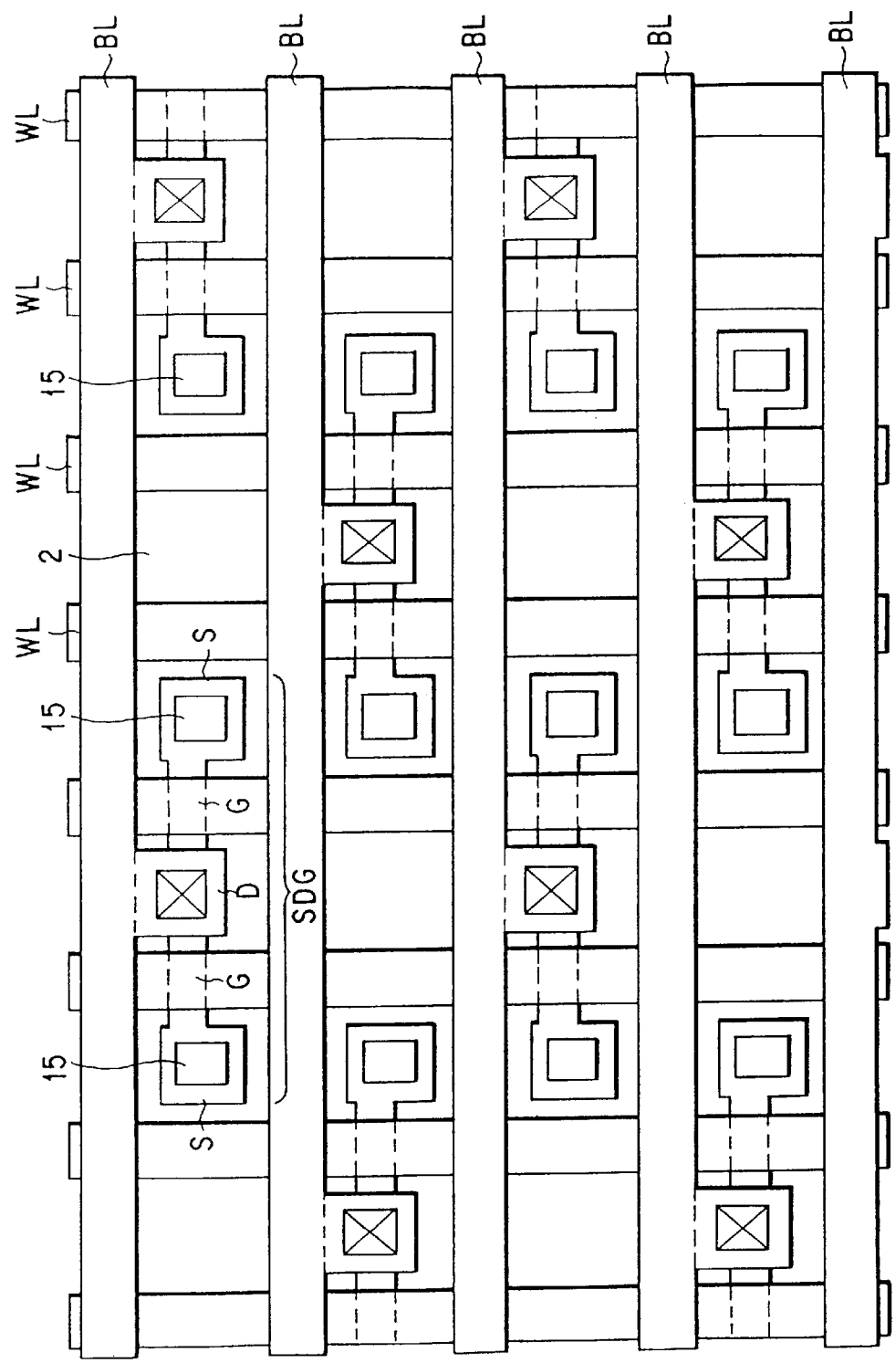
FIGS. 6–8 are schematic plan views each showing a portion of a cell array to sequentially illustrate the manufacturing steps for the ferroelectric memory cell array according to a first embodiment of the present invention.
Figure 7:
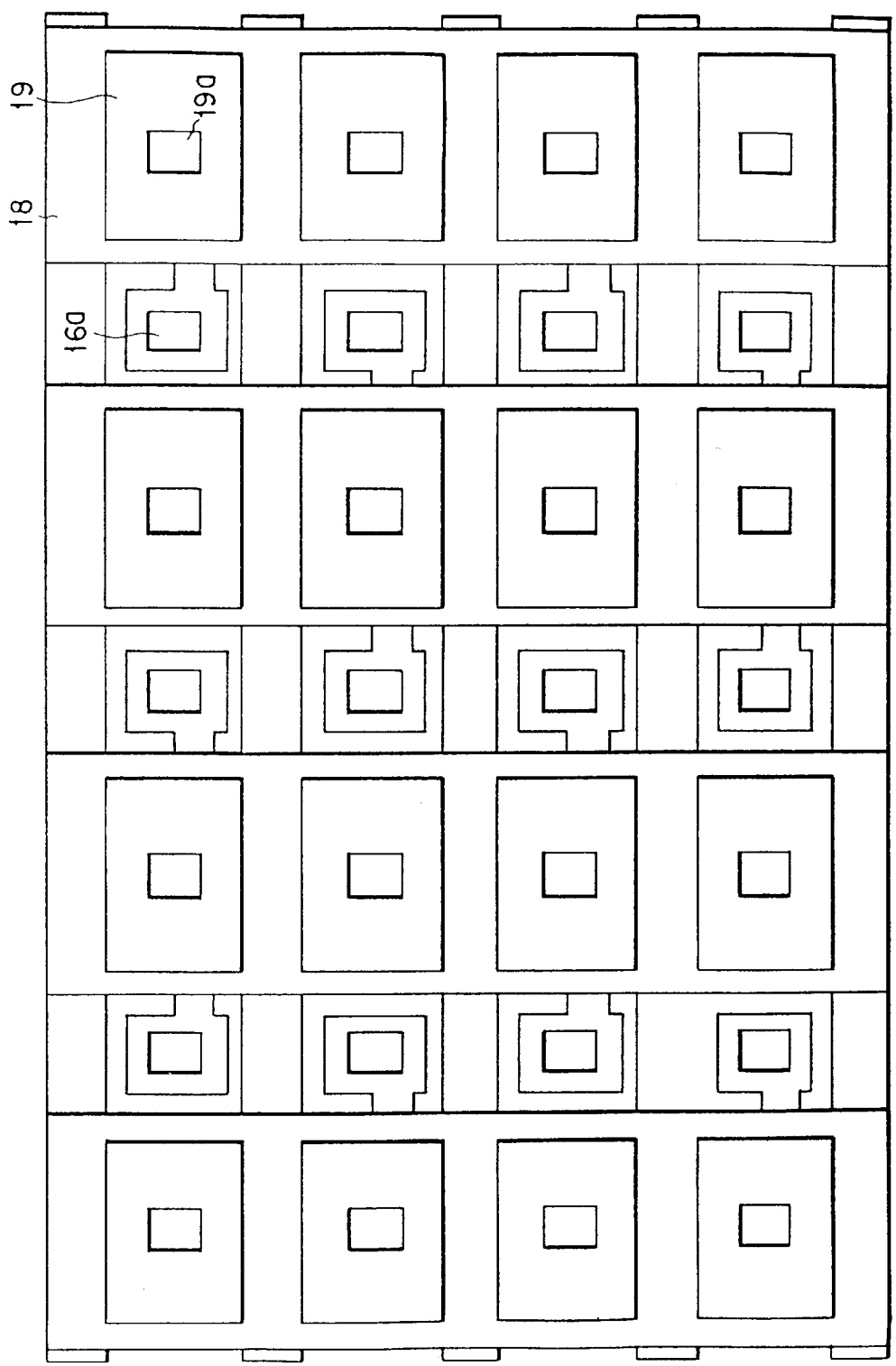
Figure 8:
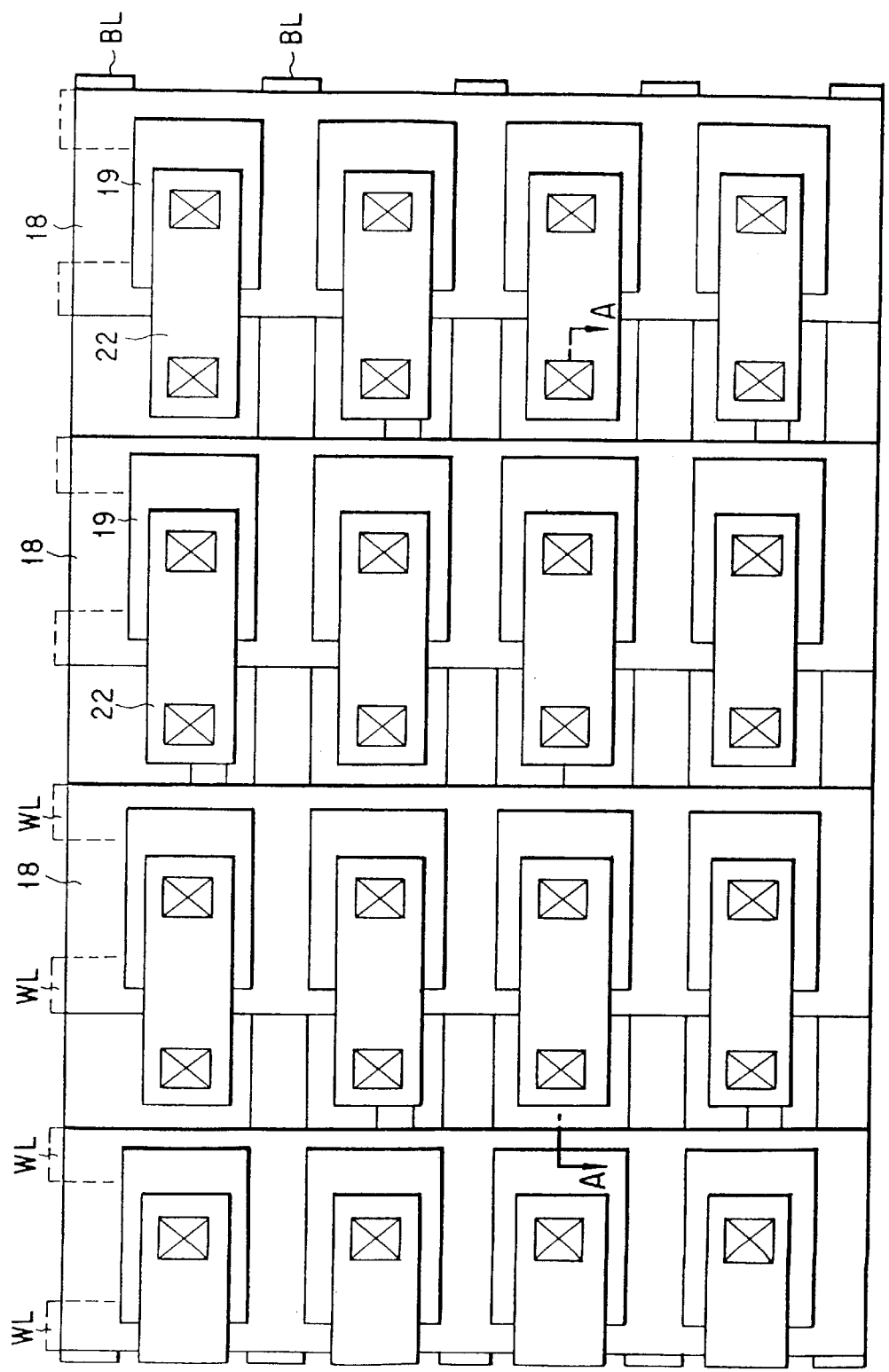

FIGS. 6–8 are schematic plan views sequentially showing a process for manufacturing the ferroelectric memory cell array according to a first embodiment of the present invention.

FIGS. 9–12 schematically show a portion of cross sectional structures in the process for manufacturing the cell array. Specifically, FIGS. 9–12 are cross sectional views taken along line A—A shown in FIG. 8 and showing an active region and a cell capacitor.

The structure of the cell array will now be described. FIG. 12 is the cross sectional view showing a manufactured cell array which is different from the above-mentioned conventional structure, in which the bit line is formed previously and the upper electrode is connected, in that the structure for connecting the switching transistor and an upper electrode 19 of the ferroelectric capacitor, and the structure of the upper electrode 19.

In this embodiment, a FRAM will now be described which has 1-transistor/1-capacitor ferroelectric memory cells such that a memory cell array is formed by disposing, into rows and columns, unit cells in each of which one charge transferring MOS transistor (a switching transistor) and one information storage ferroelectric capacitor are connected in series. In order to simplify the description, each word line is indicated by WL, each bit line is indicated by BL and each plate line is indicated by PL.

Referring to FIG. 12, reference numeral 1 represents a first conductive type (for example, p-type) semiconductor substrate (for example, a silicon substrate), as shown in FIG. 6, having a surface layer portion in which a plurality of device regions (active regions) SDG are substantially straight formed in a direction (a direction in parallel to a direction in which the bit line BL is formed) perpendicular to a direction in which the word line WL is formed, the device regions SDG being formed into rows and columns in a plan view point. An oxide film 2 to serve as an isolation region is formed between the device regions SDG.

In this embodiment, the device regions SDG on the columns are shifted respectively by a distance corresponding to the length (one pitch) of one device region SDG so that the device regions SDG are formed into a checked configuration (zigzag configuration with respect to a regular grid).

Each device region SDG has, in a portion from the central portion thereof to an end thereof, a first source S/channel (G)/drain D region into a straight shape to form the first MOS transistor. Moreover, a second drain D/channel (G)/source S region for forming a second MOS transistor is formed straight in a portion from the foregoing central portion to another end of the device region SDG. The above-mentioned central portion is formed into a drain region D common to the first and second MOS transistors.

A gate electrode G is formed on the channel region of the transistor with a gate oxide film 3 interposed therebetween. The gate electrodes G of the plural MOS transistors on the same row are sequentially connected so as to be formed into the word line WL of a group of word lines WL formed in parallel to each other.

In this case, each word line WL (the gate electrode G) is formed into a double layer structure composed of, for example, a P dope polysilicon 4 and WSi (tungsten silicide) and protected by a surface insulation film 6 and a side wall insulation film 7.

Moreover, the surface insulation film 6, the side wall insulation film 7, an interlayer insulation film 9 and an interlayer insulation film 10, which is formed to flatten the surface, are formed. In addition, a group of the bit lines BL is formed on the interlayer insulation film 10 in a direction perpendicular to the direction in which the group of the word lines WL is formed.

In this case, in the interlayer insulation film 10, a contact hole is formed above a second conductive type (which is n type in this embodiment) impurity diffusion region (the drain region) D in the central portion of each device region SDG. The bit line BL composed of a barrier metal film 11 and a conductive film 12 is formed on the interlayer insulation film 10 slightly deviated from the contact hole except for the contact portion (FIG. 6). The bit line BL is, in the contact hole, in contact with each of drain regions D of the plural device regions SDG on the same column.

In FIGS. 9–12, the bit line BL in only the contact holes is indicated by a solid line and that formed above the interlayer insulation film 10 in the rear portion of the illustrated cross section is indicated by a dashed line.

Moreover, an interlayer insulation film 13 for flattening the surface and a capping insulation film 16 are formed on the group of the bit lines BL. A stacked structure ferroelectric capacitor (a lower electrode 17, a ferroelectric film 18 and an upper electrode 19) is formed on the capping insulation film 16. Moreover, an insulation film 20 for protecting the capacitor and a passivation film 23 are formed.

In this case, the lower electrodes 17 of the plural ferroelectric capacitors on the same row are continuously formed to cover the upper portion of the central portion of the device regions SDG including the corresponding transistors or the adjacent isolation regions 2, the lower electrodes 17 being formed to run parallel to the direction in which the group of the word lines WL is formed (that is, the direction perpendicular to the bit lines BL) so as to be formed into a capacitor plate line PL.

The upper electrode 19 of the ferroelectric capacitor in each unit cell is, through the ferroelectric film 18, formed into a rectangular shape on the region of the corresponding lower electrode 17. The upper electrode 19 of the ferroelectric capacitor is, through a local interconnection wire 22, connected to the second conductive type (which is n type in this embodiment) impurity diffusion region (the source region) S at an end of the corresponding MOS transistor.

In this case, a contact hole is formed in each of the surface flattening interlayer insulation film 13, the surface flattening interlayer insulation film 10 and the interlayer insulation film 9 to correspond to the upper surface of the source regions S at the two ends of the device region SDG. A conductive plug (a capacitor contact plug) 15 is embedded in the contact hole. The capping insulation film 16 has a contact hole formed therein to correspond to the upper surface of the capacitor contact plug 15. A local interconnection wire 22 made of, for example, an aluminum material, is formed in the contact hole, on the insulation film 20 for protecting the capacitor and on the upper electrode 19.

In this embodiment, also the capacitor contact plug 15 and the interconnection wire 22 have barrier metal films 14 and 21 at the interfaces with the underlying layer. Note that the capacitor contact plug 15 and the wire 22 are made of different materials. Specifically, it is preferable that the material of the capacitor contact plug 15 be a refractory metal and the material of the wire 22 be an aluminum-based material, a copper-based material or a conductive polysilicon-based material.

A region in which the wire 22 is in contact with the capacitor contact plug 15 has an area larger than the upper surface of the capacitor contact plug 15, the contact region being in contact with the top surface of the capacitor contact plug 15 and the interlayer insulation film 13 formed around the top surface. As a result, the contact resistance between the wire 22 and the capacitor contact plug 15 can be reduced and a margin for aligning a mask for use when the contact hole is formed in the capping insulation film 16 on the capacitor contact plug 15 can be provided.

A method of manufacturing the above-mentioned cell array will sequentially be described with reference to the drawings.

Figure 9:
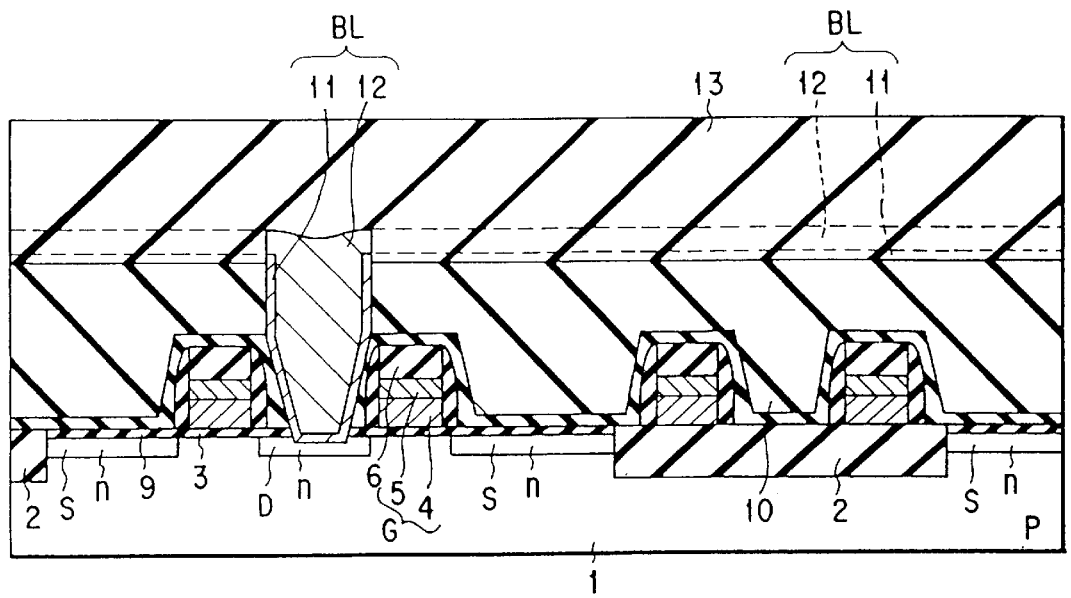

As shown in FIGS. 6 and 9, a process similar to a process for forming a usual CMOS DRAM cell is performed formed so that an array of the MOS transistors for forming the cells on the semiconductor substrate 1 is formed.

Referring to FIGS. 6 and 9, reference numeral 2 represents an oxide film to serve as a region for isolating the device, the oxide film 2 being selectively formed on the surface layer of the substrate. Symbols D and S represents drain/source regions formed selectively in the device region in the surface layer portion of the substrate and made of impurity diffusion layers having a conductive type opposite to that of the substrate. Reference numeral 3 represents a gate oxide film for the MOS transistor, the gate oxide film 3 being formed on the surface of the substrate. Symbol G represents a gate electrode (a portion of the word line WL) for the MOS transistor, the gate electrode G being formed on the gate oxide film 3.

Then, the interlayer insulation film 10 is formed on the substrate including the gate electrode G, and the contact hole is formed in a portion corresponding to the drain region D of the interlayer insulation film 10. Moreover, the barrier metal film 11 and the conductive film 12 are sequentially formed in the contact hole and on the interlayer insulation film 10. The conductive film 12 and the barrier metal film 11 are patterned so that the bit lines BL are formed.

Then, the flattening interlayer insulation film (for example, a BPSG film) 13 is deposited on the substrate including the bit lines BL, and then chemical mechanical polishing (CMP) is performed by about 200 nm so as to be flattened.

Figure 10:
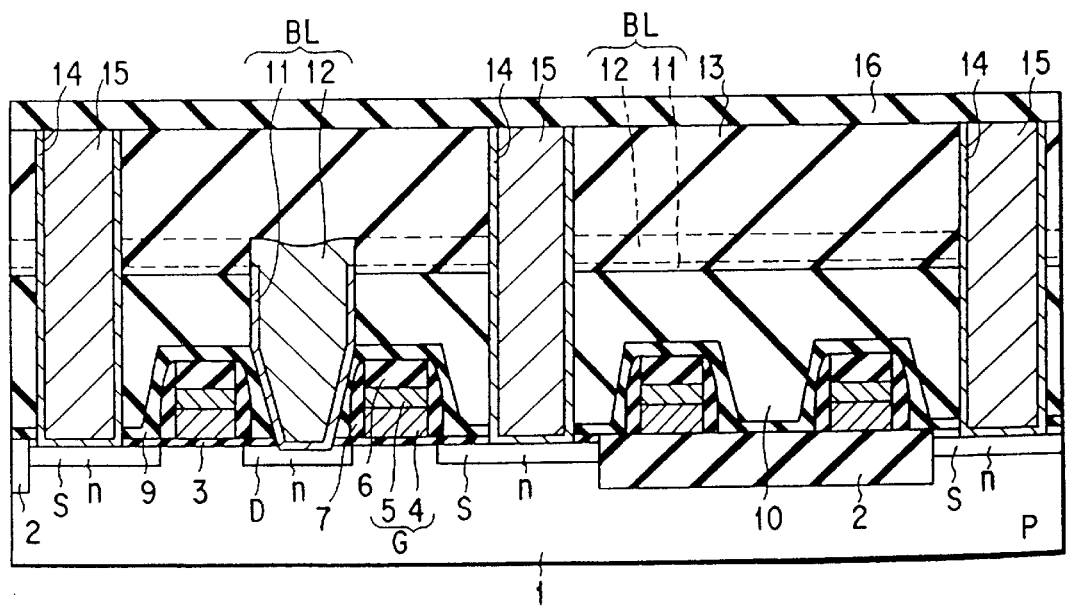

Then, as shown in FIG. 10, a lithography process and etching process are performed so that a contact hole having size of 0.8 $\mu$m×0.8 $\mu$m is selectively formed in a portion above the source region S of each of the interlayer insulation film 13 and the interlayer insulation film 10, the contact hole being used for the capacitor plug. The overall thickness of the interlayer insulation film 13 and the interlayer, insulation film 10 is 1500 nm and the aspect ratio of the contact hole is 1.9.

Then, the barrier metal film (for example, a TiN film) 14 is deposited on the inner surface of the contact hole to have a thickness of 20 nm, and then tungsten is deposited by, for example, a metal CVD apparatus to have a thickness of 1700 nm, which is larger than the total thickness of the interlayer insulation film 13, and the interlayer insulation film 10 so as to be fully embedded in the contact hole.

Then, the tungsten film and the barrier metal film on the flattening interlayer insulation film 13 are removed by etching back so that the capacitor contact plug 15 is obtained, as shown in FIG. 1.

Since the barrier metal film 14 has been formed on the inner surface of the contact hole when the capacitor contact plug 15 is embedded, diffusion from the capacitor contact plug 15 to the impurity diffusion layer for the source region can be prevented.

Then, the surface of the interlayer insulation film 13 is sufficiently flattened by CMP, as shown in FIG. 10. Then, the capping insulation film 16 is deposited to have a thickness of 150 nm.

Then, as shown in FIGS. 7 and 11, a conductive film for the lower electrode 17 (the capacitor plate line PL) of the capacitor, the ferroelectric film 18 for the capacitor insulation film and the upper electrode 19 for the capacitor are sequentially formed on the capping insulation film 16, and then patterning is performed so that the ferroelectric capacitor is formed. Then, the insulation film 20 for protecting the capacitor is formed.

At this time, the ferroelectric film 18 may be made of the PZT (PbZr$_x$Ti$_{1-x}$O$_3$), PLZT ((Pb, La)(Zr, Ti) O$_3$) or SBT (SrBi$_2$Ta$_2$O$_9$). The lower electrode 17 and the upper electrode 19 for the capacitor may be made of Pt or the like (Pt, Ir, IrO$_x$, IrO$_2$, RuO$_2$ or their combination).

Then, portion corresponding to the capacitor contact plug 15 of the insulation film 20 for protecting the capacitor and the capping insulation film 16 is opened. Moreover, a portion above the upper electrode 19 of the insulation film 20 for protecting the capacitor is opened. In this case, an opening portion (16a shown in FIG. 7) larger than the area of the upper end of the capacitor contact plug 15 and an opening portion (19a shown in FIG. 7) smaller than the area of the upper electrode 19 for the capacitor are formed.

Then, as shown in FIGS. 8 and 12, a TiN film 21 for the barrier metal film and a conductive film 22, such as an Al wire containing Si and Cu are, as materials of wires for connecting the capacitor contact plug 15 and the upper electrode 19 for the capacitor, sequentially deposited to cover the insulation film 20 for protecting the capacitor by an RF sputtering method, a metal CVD method or an MOCVD method. The materials for the wires are patterned so that wires 21 and 22 are formed, and then a passivation film 23 is deposited on the entire surface including the wires 21 and 22.

When the ferroelectric film 18 is formed, rapid thermal annealing is, for about 10 seconds, performed in an oxygen atmosphere and a high temperature usually at about 750° C. after the ferroelectric material has been deposited in order to crystallize the ferroelectric material and improve the ferroelectric characteristic thereof.

In order to recover deterioration in the ferroelectric characteristic occurring when patterning of the capacitor is performed after the ferroelectric material has been deposited, annealing is performed for about 30 minutes at a high temperature of 600° C. in an oxygen atmosphere.

Since the contact hole for the wiring is not yet opened in the process performed at high temperatures and in the oxygen atmosphere, the capping insulation film 16 prevents oxidation of the material of the capacitor contact plug. Even if the capacitor contact plug 15 is covered with the capping insulation film 16, slight and partial oxidation of the surface of the material of the capacitor contact plug cannot be prevented because of the annealing process which is performed in the high temperature and oxygen atmosphere.

When the material for the wiring is deposited on the capacitor contact plug 15, it is preferable that a process for etching the surface oxide film of the capacitor contact plug 15 be added before the foregoing deposition process. As a result, the capacitor contact plug 15 and the wiring material can stably be connected to each other. The etching operation can be performed by a reverse sputtering method in which the electrode of the metal sputter is switched.

In general, the contact resistance between the active layer of the MOSFET and the contact plug is lowered by performing a sintering operation at 450° C. by using a mixed gas of hydrogen and nitrogen. However, the sintering operation cannot be performed when the ferroelectric material is employed because the characteristics of the ferroelectric capacitor deteriorates.

On the other hand, the manufacturing method according to this embodiment having the step of forming the capacitor contact plug 15 before the ferroelectric capacitor is formed enables the sintering process to be employed, which is the same as that employed to manufacturing the usual MOS type LSI. Specifically, sintering can be performed by using hydrogen, nitrogen or their mixture gas at about 400° C. to 500° C. As a result, an advantage can be realized in that variations of various device parameters of the gate threshold Vth and the potential of the substrate of the MOSFET can be prevented.

It is preferable that the capacitor contact plug 15 be made of a material different from the material for the wire and having oxidation resistance, heat resistance and a low contact resistance characteristic. Moreover, it is preferable that the material can be embedded in the contact hole and is a refractory metal exemplified by tungsten, molybdenum, titanium or palladium.

The reason for this will now be described. The capacitor contact plug 15 is subjected to a high temperature heat treatment in an oxygen atmosphere when the ferroelectric capacitor is formed after the capacitor contact plug 15 has been formed by embedding. If a material, such as a polysilicon material or an aluminum-based material which can easily be oxidized is employed to form the capacitor contact plug 15, the capacitor contact plug 15 is oxidized and parasitic resistance thereof is raised.

Although this embodiment has the structure such that TiN is employed to serve as an interlayer between the AlSiCu wiring material and the tungsten contact plug, a laminate Ti/TiN may be employed. The material of the wire is not limited to the AlSiCu material. For example, an aluminum-based material, a copper-based material or a conductive polysilicon wiring material may be employed.

In this embodiment, the contact resistance between the contact plug for the capacitor and the material of the wire is lowered by employing a connection structure arranged such that the area of wiring is, in their contact surface, larger than the area of the upper surface of the contact plug for the capacitor.

That is, the electric wires on the contact plug (AlSiCu/TiN) for the capacitor are arranged to be in contact with both of the-upper surface of the contact plug (W) and the interlayer insulation film 13 around the contact plug (W).

A method which is modification of the first embodiment will now be described with reference to FIGS. 13A–13F in which Pt or a material (Ir, an Ir oxide, a Ru oxide or the like) for forming an electrode is employed to form the upper electrode of the ferroelectric capacitor made of PZT or SBT. Moreover, the material for forming the upper electrode is precisely processed to a 0.1 micron level. Note that the above-mentioned method may be applied to form an element except for the electrode for the ferroelectric capacitor.

Initially, a lower electrode film 17a for the ferroelectric capacitor and a ferroelectric thin film 18a are sequentially formed on the capping insulation film 16, as shown in FIG. 13A. In this case, Pt is deposited to form the lower electrode film 17a and to have a thickness of 175 nm. Moreover, a PZT film is formed by deposition to serve as the ferroelectric thin film 18a and to have a thickness of 300 nm.

Then, a TEOS (tetra-ethyl-ortho-silicate) oxide film 20a is, as shown in FIG. 13B, deposited on the ferroelectric thin film 18a to have a thickness of 300 nm.

Then, as shown in FIG. 13C, PEP (photo engraving process) is performed to-selectively form opening portions in the TEOS oxide film 20a at positions corresponding to the upper electrodes.

Then, as shown in FIG. 13D, the Pt film 19a for forming the upper electrode is deposited to have a thickness larger than that of the TEOS oxide film 20a.

Then, as shown in FIG. 13E, etching back or CMP is performed so that the Pt film 19a on the TEOS oxide film 20a is removed. Then, a usual photolithography technique is employed so that an elongated resist pattern is formed. Anisotropic etching is performed by using the resist pattern as a mask so that the TEOS oxide film 20a/the ferroelectric thin film 18a/the lower electrode film 17a are sequentially patterned.

As a result, the desired and elongated thin ferroelectric film 18 and the lower electrode 17 are obtained.

At this time, the same mask pattern is used to sequentially etch the TEOS oxide film 20a, the ferroelectric thin film 18a and the lower electrode film 17a so that the TEOS oxide film 20a, the thin ferroelectric film 18 and the lower electrode 17 are formed into substantially the same planar shape in a self alignment manner.

Then, as shown in FIG. 13F, the insulation film 20 for protecting the capacitor is formed to cover the surfaces of the TEOS oxide film 20a, the upper electrode 19, the thin ferroelectric film 18 and the lower electrode 17. The insulation film 20 prevents the pattern edges of the thin ferroelectric film 18 and the lower electrode 17 from being damaged by the anisotropic etching process. Moreover, the insulation film 20 prevents deterioration in the electric with standing voltage of the thin ferroelectric film 18. The insulation film 20 for protecting the capacitor is a $SiO_2$ film formed by decomposing TEOS by, for example, a plasma CVD method or a $SiO_2$ film formed by a thermal oxidation method.

Then, an opening portion having an area smaller than that of the upper electrode 19 is formed in a portion corresponding to the upper surface of the upper electrode 19 of the insulation film 20 for protecting the capacitor, and then the electric wire 22 and the passivation film 23 are formed.

As described above, the method of forming the ferroelectric memory cell according to this embodiment enables the electric wire for connecting the upper electrode of the capacitor and the top end of the contact plug to each other to be formed by, for example, the sputtering method after the contact plug layer is embedded into a region of the source/drain region of the switching transistor and then the ferroelectric capacitor has been formed.

As a result, the wiring film deposition process to be performed after the ferroelectric memory cell has been formed, using a metal CVD apparatus or a MOCVD apparatus in the reducing atmosphere, can be omitted. Thus, deterioration in the electric characteristics, such as the remanant polarization of the capacitor, can be prevented.

Since the structure is formed such that the upper electrode 19 is embedded in the opening portion of the TEOS oxide film 20a, the area of the upper electrode 19 can be reduced. Thus, the area of the unit cell can be reduced and, therefore, a dense FRAM can be manufactured.

Figure 14:
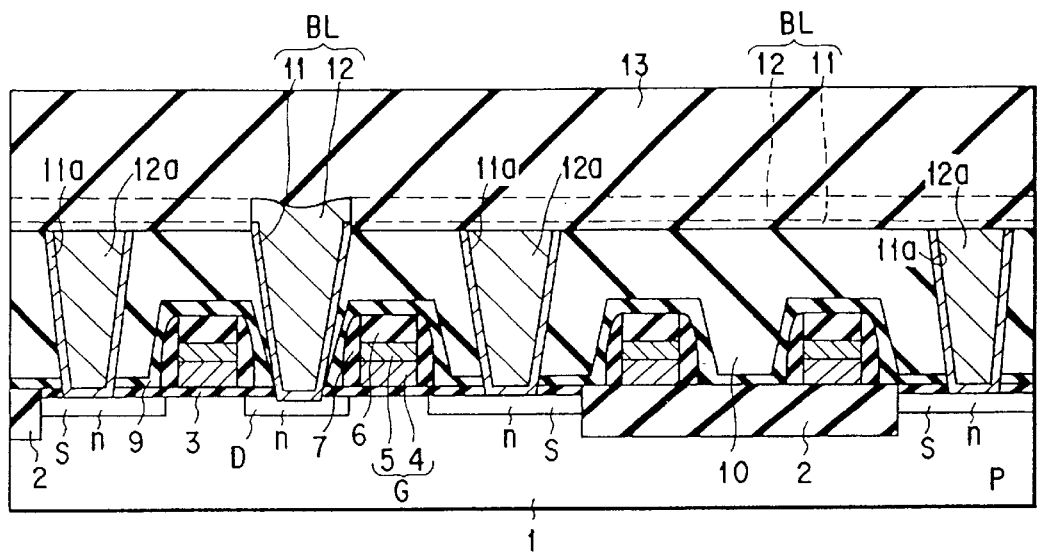
FIGS. 14 and 15 are cross sectional views showing a FRAM cell for sequentially showing a modification of the manufacturing method according to the first embodiment.
Figure 15:
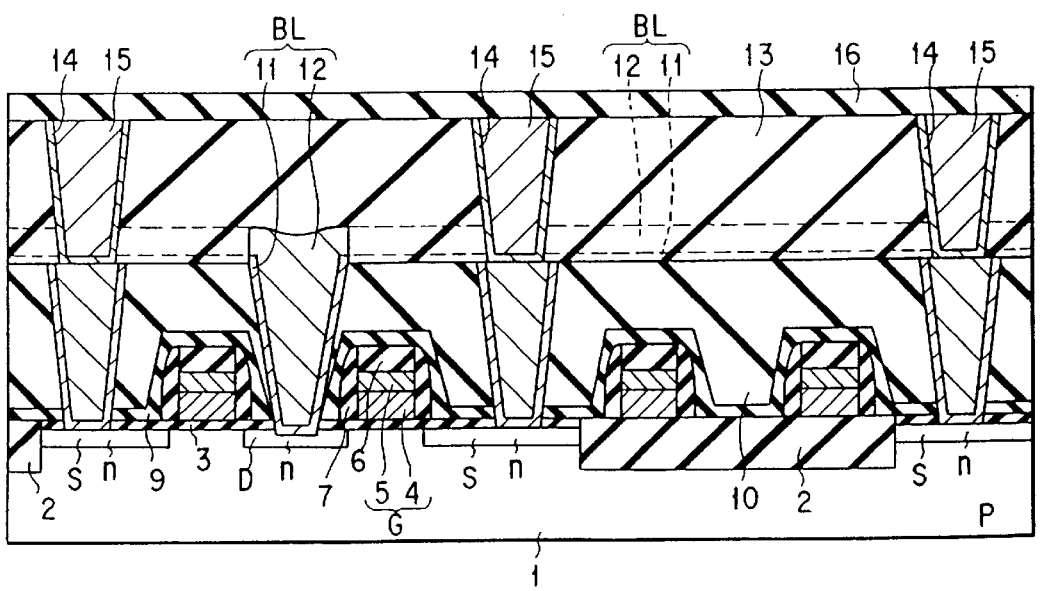

Although the foregoing embodiment is structured such that the capacitor contact plug is formed in one step, the capacitor contact plug may be formed in two steps. Cross sections of a manufacturing method according to this modification are shown in FIGS. 14 and 15. With the method according to this modification, the first capacitor contact plugs 11a and 12a are formed simultaneously with the process for forming the bit line BL (11 and 12). Then, second capacitor contact plugs 14 and 15 are formed on the interlayer insulation film 13 formed on the first capacitor contact plugs 11a and 12a such that the second capacitor contact plugs 14 and 15 are connected to the top surfaces of the first capacitor contact plugs 11a and 12a.

Since the above-mentioned structure is employed, the aspect ratio of each contact hole can be lowered. Therefore, when the contact plug layer is embedded, embedding into the contact hole can easily be performed.

In the first embodiment, each of the contact plug portion of the bit line BL (11 and 12) and the capacitor contact plugs 14 and 15 (including a case where the capacitor contact plug is composed of the first capacitor contact plugs 11a and 12a and the second capacitor contact plugs 14 and 15) may be formed to have an inversely tapered side surface such that a size of the upper opening portion is larger than a size of the opening portion of the bottom surface, as shown in FIGS. 14 and 15.

As a result, even if the interval between the adjacent word lines is reduced because the size of the cell is reduced, a required distance can be maintained between the word line and the lower portion of the contact plug. Moreover, a required opening area (the contact area for the wire connection) of the contact hole can easily be maintained. Thus, the margin permitted to the manufacturing process can be enlarged.

Second Embodiment

Figure 16:
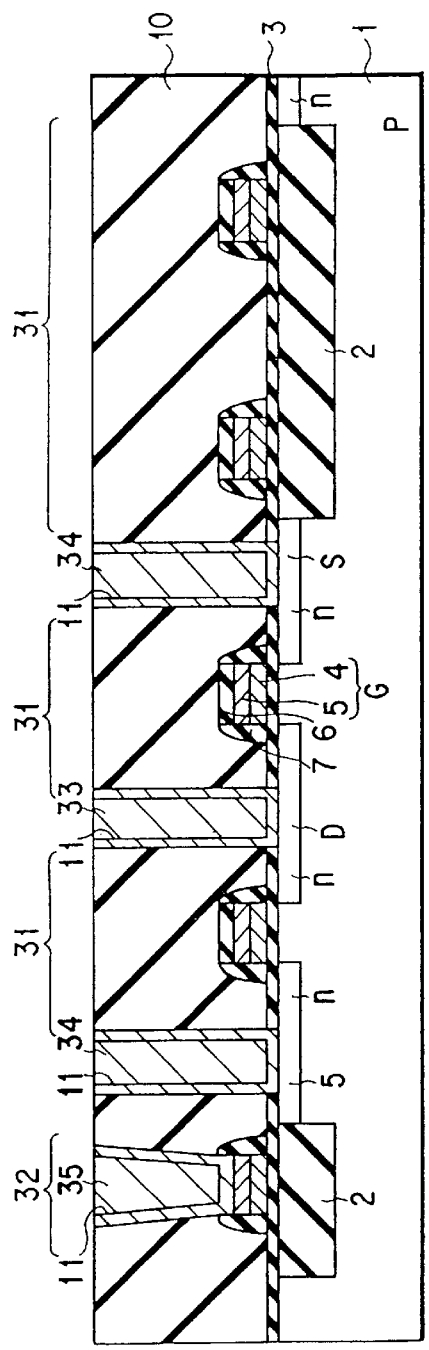
FIGS. 16 and 17 are cross sectional views of the FRAM cell for sequentially showing the manufacturing process for the FRAM cell array according to a second embodiment of the present invention.
Figure 17:
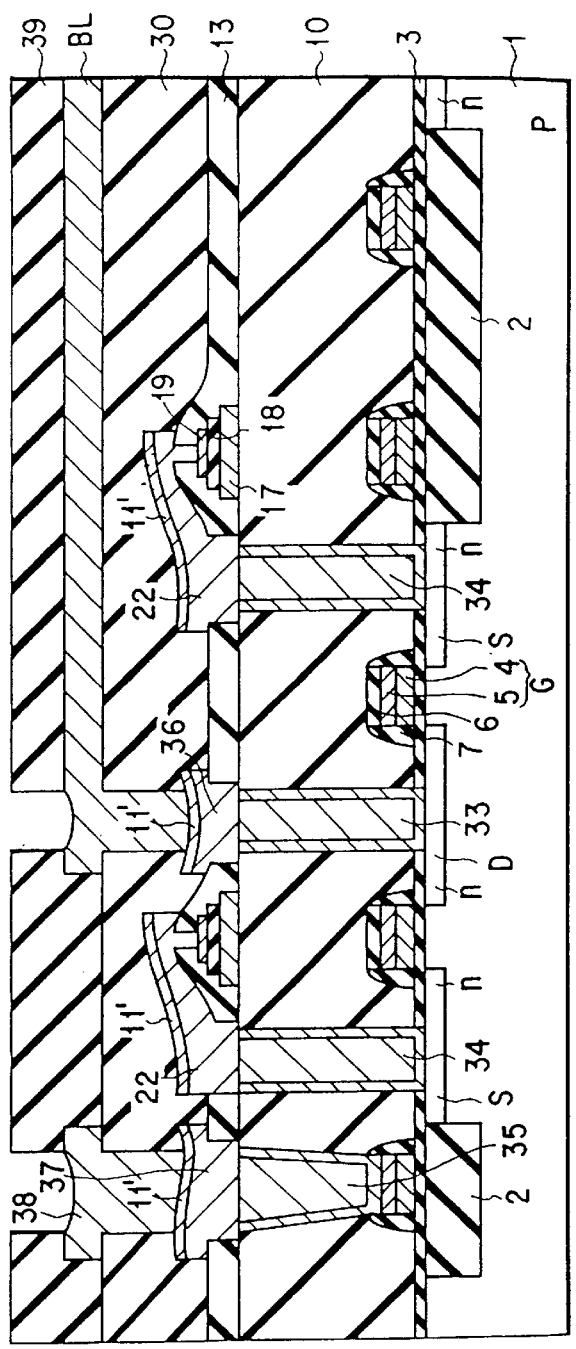
Figure 18:
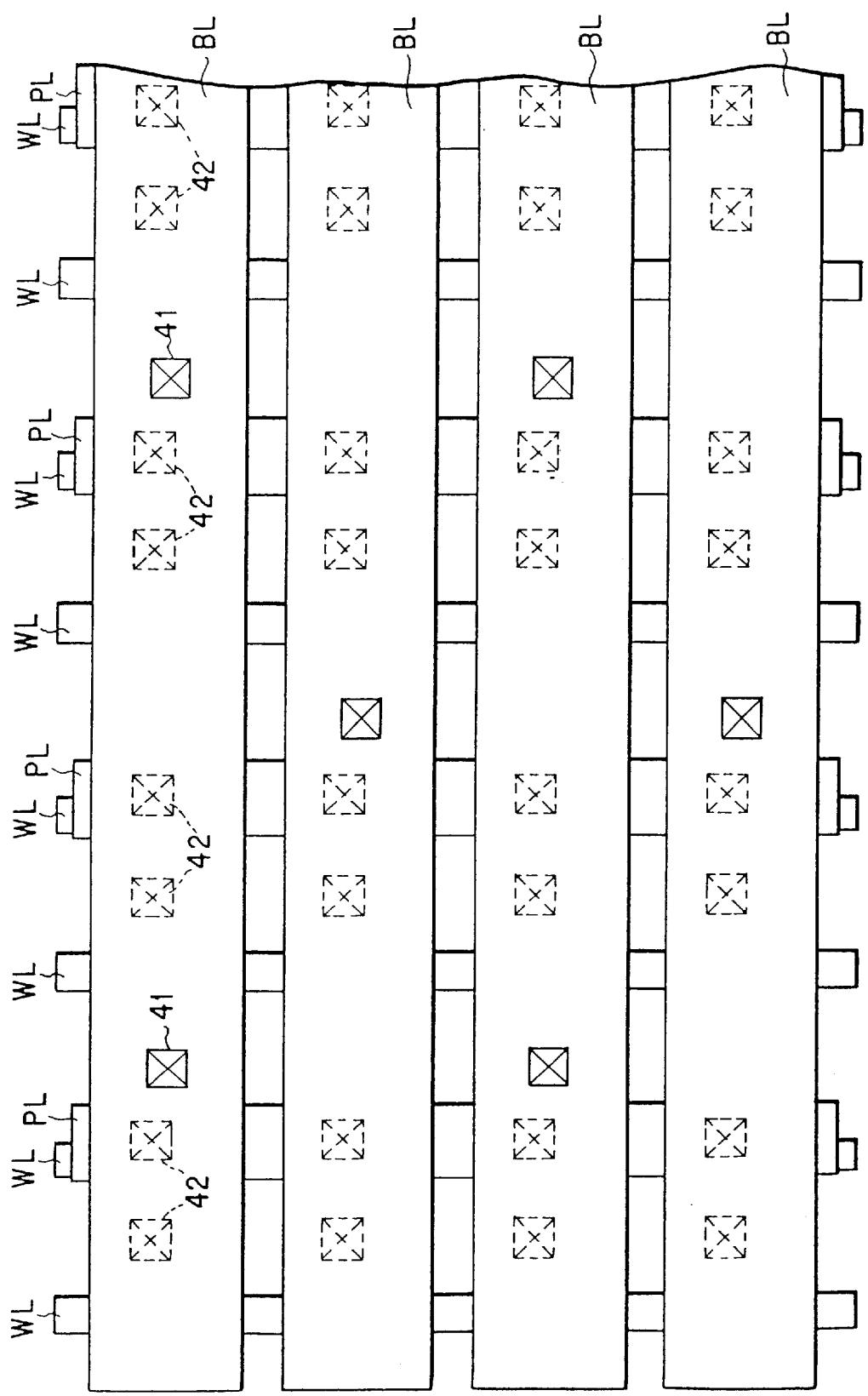
FIG. 18 is a schematic plan view showing the FRAM cell array according to the second embodiment.

FIGS. 16 and 17 are schematic cross sectional views of a FRAM for sequentially illustrating the method of manufacturing the FRAM according to a second embodiment of the present invention and other devices which are consolidated on the FRAM. FIG. 18 is a schematic plan view showing a portion of the FRAM cell array according to this embodiment. The same elements as those according to the first embodiment are given the same reference numerals.

The manufacturing method according to this embodiment is characterized in that a second layer electric wire (a bit line or another electric wire) of a double-layer wiring structure is connected to a first layer electric wire by reflowing of least one material (which is aluminum in this embodiment) among Al, AlCu, AlCuSi, $WSi_2$ and Cu to plug the via hole.

Referring to FIGS. 16 and 17, a MOS transistor 31 for the switch of the memory cell and another MOS transistor 32 for a consolidated device other than the memory cell are formed on the semiconductor substrate 1.

A bit line contact plug 33 connected to the drain region D and the source region S of the switching MOS transistor 31, a capacitor contact plug 34 and a contact plug 35 connected to the gate electrode of the other MOS transistor 32 for the consolidated device are embedded in the first insulation film 10 covering each of the above-mentioned transistors and having a flattened surface (that is, the stepped portion of the surface is flattened).

Holes are selectively formed in the interlayer insulation film 13 for coverage of the substrate including the lower electrode 17, the thin ferroelectric film 18 and the upper electrode 19, to respectively correspond to the upper surfaces of the bit line contact plug 33, the capacitor contact plug 34 and the contact plug 35 for the consolidated device and the upper electrode 19. Moreover, there are formed a plug connection line 36 (a bit line connection pattern) connected to the bit line contact plug 33 through the above-mentioned hole, the upper electrode lead line (a capacitor line) 22 connected to the capacitor contact plug 34 and the upper electrode 19 and a first layer wiring 37 connected to the contact plug 35 for the consolidated device.

The upper electrode lead line 22 and the plug connection line 36 for the bit line contain at least one material among Al, AlCuSi, AlCu, W, TiN and Ti. The upper electrode lead line 22 and the plug connection line 36 for the bit line are made of the same wiring layer as that of the first layer wiring 37. A metal layer 11' made of tungsten, TiN or Ti is selectively formed on the upper surface of the upper electrode lead line 22, the bit line plug connection line 36 and the first layer wiring 37 by a sputtering method to protect the ferroelectric film 18 from being damaged.

A third insulation layer 30, which covers the upper surface of the substrate including the foregoing electric wires and which has a flattened surface, has via holes formed selectively to correspond to the upper portion of the bit line plug connection line 36 and thhe first layer wiring 37. To plug the via holes, at least one material (which is aluminum in this embodiment) among Al, AlCu, AlCuSi, $WSi_2$ and Cu is allowed to reflow. Moreover, a bit line BL connected to the bit line plug connection line 36 through the via hole and a second layer wiring 38 connected to the first layer wiring 37 through the via hole are formed. Then, the passivation film 39 is formed, and holes are formed in portions in which pads will be formed.

If the underlying electric wire is made of the Al-based material, there is a risk that the underlying wire is melted and voids are generated depending upon the temperature of the sputtering deposition when the Al of the second layer wiring 38 is allowed to reflow. Therefore, tungsten, TiN or Ti is deposited by sputtering to form a barrier layer which is in directly contact with the via metal. In this embodiment the metal barrier layer 11' is selectively formed right below the via contact of the multilayered wiring so as to be used as a film for preventing generation of voids.

Referring to FIGS. 16–18, the process will sequentially be described.

Initially, a process similar to the process for forming a conventional CMOS type DRAM is performed so that the memory cell transistor 31 and the MOS transistor 32 for another device are formed on the semiconductor substrate 1.

Reference numeral 2 represents an isolation region formed selectively in the surface layer portion of the substrate, symbols D and S represent drain/source regions each in the form of an impurity diffusion layer formed selectively in the device forming region in the surface of the substrate and having a conductive type opposite to that of the substrate, reference numeral 3 represents a gate insulation film for the MOS transistor and formed on the surface of the substrate and symbol G represents a gate electrode (a portion of the word line WL) for the MOS transistor and formed on the gate oxide film 3.

The isolation region 2 may have an arbitrary structure realized by a LOCOS (Local Oxidation of Silicon) or STI (Shallow Trench Isolation).

Then, the interlayer insulation film (for example, a BPSG film) 10 for flattening is deposited on the substrate including the gate electrode G, and then the surface is flattened by CMP.

Then, a contact hole is selectively formed in the first interlayer insulation film 10. Specifically, a bit line contact hole is formed in a portion corresponding to the upper portion of the drain region D, a contact hole for the capacitor plug is formed in a portion corresponding to the upper portion of the source region S and a contact hole for another electric wire is formed.

Then, a sputtering method is employed to evaporate the barrier metal film (Ti or TiN) 11 in the foregoing contact holes and on the first interlayer insulation film 10. Then, a CVD method is employed to deposit a tungsten film and the contact plugs 33, 34 and 35 are formed in the contact holes. Then, etching back or CMP is performed so that the surface of the first interlayer insulation film 10 is exposed. The contact plugs 33, 34 and 35 may be formed to have an inversely tapered side surface, as in the first embodiment, to enlarge the margin for the manufacturing process.

Then, Pt/Ti/TiN is sputtered on the first interlayer insulation film 10 including each of the foregoing contact plugs to serve as a conductive film for the lower electrode 17 (capacitor plate line PL) for the capacitor, as shown in FIG. 17. Then, a PZT film is formed to serve as the ferroelectric film 18 for the capacitor. Then, Pt film is formed to serve as the upper electrode 19 for the capacitor. Then, RIE is employed to sequentially pattern the upper electrode 19, the ferroelectric film 18 and the lower electrode 17. If the ferroelectric film 18 is damaged at this time, it can be restored by performing heat treatment at about 500° C. to 600° C. in an oxygen atmosphere.

Then, plasma CVD is performed so that the second interlayer insulation film (the capacitor protective film) 13 is formed, and the chemical dry etching (CDE) and RIE are employed to form contact holes for establishing the connection between the contact plugs 33, 34 and 35 and the upper electrode 19.

Then, a sputtering method is employed to sequentially deposit Al and W so that the capacitor electric wire 22 for establishing the connection between the capacitor contact plug 34 and the upper electrode 19 for the capacitor is formed. Simultaneously, the bit line connecting contact pattern 36 and the first layer wiring 37 for the consolidated device except the memory cell are formed.

Then, the third interlayer insulation film 30 is formed, and then its surface is flattened, and then via holes for establishing the connection with the bit line contact pattern 36 and via holes for establishing the connection with the first layer wiring 37 for the consolidated device other than the memory cell are formed. Then, an RF magnetron sputtering method (an Al reflowing method in which Al is melted to plug the via hole in a liquid state) is employed in such a manner that the temperature of the substrate is raised to 400° C. to 470° C. in an Ar atmosphere, so that the second wiring layer is deposited to plug the via holes. Then, the second wiring layer is patterned so that the bit line BL and the second layer wiring 38 for the consolidated device are formed.

As a result, the bit line BL is connected to the drain region D of the switching MOS transistor 31 of the memory cell through the via hole portion, the bit line contact pattern 36 and the bit line contact plug 33. The second layer wiring 38 for the consolidated device is connected to the MOS transistor 32 for the consolidated device through the first layer wiring 37.

The second layer wiring 38 may be formed using the film deposited by the Al reflowing method as it is. As an alternative to this, Al-based metal in the portion other than the via hole portion may be removed by CMP to be flattened, and then metal for forming the second layer wiring 38 is again deposited so as to be patterned.

If the semiconductor integrated circuit has a double-layered wiring structure, the top passivation film 39 is deposited, and the pad portion is opened. If semiconductor integrated circuit having a three or more layered wiring structure is manufactured, the interlayer insulation film 30 is formed, and then a process in which a wiring layer is deposited by an Al reflowing method and patterning is repeated by a required number of times. Then, the top passivation film 39 is deposited, and then the pad portion is opened. In this embodiment, a portion of the first wiring layer 37 may be formed into the pad portion FIG. 17 shows the process in which holes are selectively formed to correspond to the upper portion of the bit line contact plug 33 of the interlayer insulation film 30; and then the bit line is brought into contact with the bit line contact pattern 36. However, a method may be employed in which the bit line contact pattern 36 is arbitrarily arranged on the first interlayer insulation film 10 to bring the bit line into contact with a position different from the portion above the bit line contact plug 33. This method enables the process margin to be enlarged. Moreover, the cell array can further freely be designed. It is also possible for the first layer wiring 37 of the consolidated device other than the memory cell to be arbitrarily arranged on the first insulating layer 10.

A cell array having a structure (FCOB: Ferro Capacitor On Bit-line) in which the bit line is formed below the ferroelectric capacitor as shown in FIG. 12 enables the memory cell portion to be designed further freely. However, the thickness of the insulation film is enlarged by a degree corresponding to the thickness of the interlayer insulation film 13 formed on the bit line. Therefore, this structure is disadvantageous for a consolidated device other than the memory.

However, when the structure as shown in FIG. 17 is employed in which the bit line BL is formed on the upper layer of the ferroelectric capacitor and the bit line BL is formed by the second wiring layer, the memory cell portion can further freely be designed. As a result, the area of the cell can be reduced.

A flat pattern will now be described with reference to FIG. 18. A structure is shown in FIG. 18 in which the bit line BL is formed above the word line WL in a direction perpendicular to the word line WL to have a constant width. As compared with the structure shown in FIGS. 6–8, the position, width and the contact portion of the bit line BL are different. Since the other portions are the same, the same elements as those shown in FIGS. 6–8 are given the same reference numerals and the same elements are omitted from description.

Referring to FIG. 18, reference numeral 41 represents a contact portion in which the bit line BL is connected to a bit line contact pattern (36 shown in FIG. 17), and 42 represents a contact portion in which a local connection electric wire (22 shown in FIG. 17) formed in an intermediate layer between the word line WL and the bit line BL is connected with respect to the upper electrode (19 shown in FIG. 17) of the capacitor having the stacked structure formed for each unit cell and the capacitor contact plug (34 shown in FIG. 17). Symbol PL represents a capacitor plate line formed such that the lower electrode (17 shown in FIG. 17) of the capacitor is continued.

That is, when the structure shown in FIGS. 16. and 17 in which the bit line BL is formed in the upper layer portion of the ferroelectric capacitor is employed, the cell array can be formed as shown in FIG. 18. The width of the bit line BL can be enlarged as compared with the above-mentioned FCOB structure and thus the resistance of the bit line can be lowered. Therefore, a significant advantage can be realized to operate the memory.

Therefore, when the FRAM memory and another LSI are consolidated, it is more advantage when the bit line BL is formed upper than the second wiring layer as compared with the FCOB structure in which the bit line BL is formed lower than the ferroelectric capacitor or in the first layer.

In order to make a comparison with the present invention, the via hole was plugged by Ti (sputtering)/TiN (sputtering)/W (CVD) in place of plugging the via hole by the Al reflow. Then, an influence of the difference in the process on the quantity of polarization of the ferroelectric film of the ferroelectric capacitor was examined.

As a result, the quantity of polarization of the ferroelectric film of the ferroelectric capacitor obtained in the second embodiment was 30 $\mu C/cm^2$, while the quantity of the polarization in the comparative example was deteriorated to about 3 $\mu C/cm^2$.

The quantity of polarization of the ferroelectric material of the FRAM device is directly effective to obtain a satisfactory sensing margin. Since the reliability can be improved in proportion to the quantity of polarization, the second embodiment is advantageous as compared with the comparative example.

Third Embodiment

Figure 19:
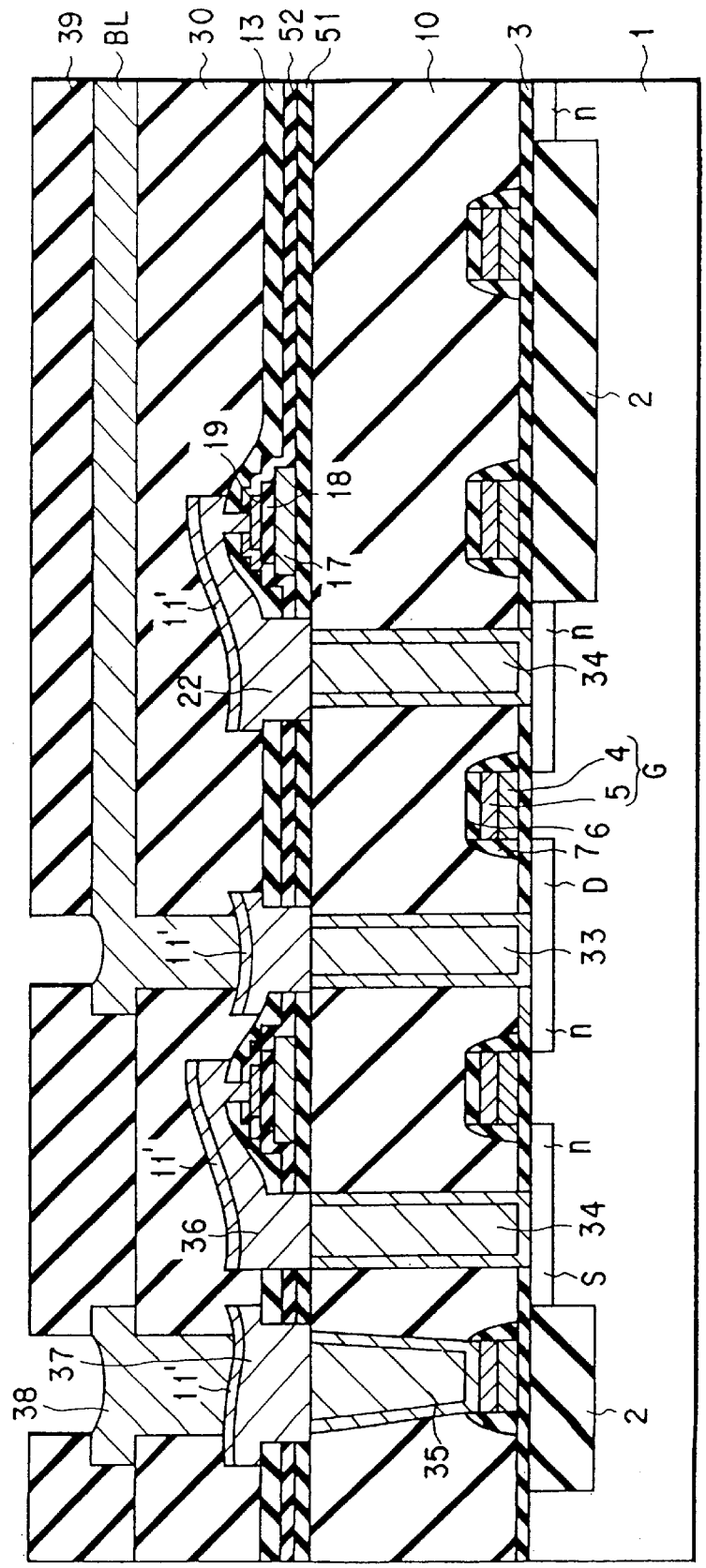
FIG. 19 is a cross sectional view of the FRAM cell for illustrating a method of manufacturing the FRAM cell array according to a third embodiment of the present invention.

FIG. 19 is a cross sectional view schematically showing a portion (including a SDG region and a cell capacitor) of cross sectional structure of a FRAM cell according to a third embodiment of the present invention.

Although the structure of the FRAM cell shown in FIG. 19 is basically similar to the structure of the FRAM cell shown in FIG. 17, the third embodiment is different in that a ferroelectric capacitor is formed above the first interlayer insulation film 10 with a first $SiO_2$ film 51 interposed therebetween and a second $SiO_2$ film 52 is formed on the ferroelectric capacitor.

The process for manufacturing the FRAM shown in FIG. 19 is different from the foregoing process shown in FIGS. 16 and 17 in that (1) after the surface of the first interlayer insulation film 10 has been exposed by etching back, a process is added in which the first $SiO_2$ film 51 is deposited on the overall surface by a sputtering method; (2) after the ferroelectric capacitor has been formed, a process is added in which the second $SiO_2$ film 52 is deposited on the overall surface to have thickness of about 100 nm by a sputtering method; (3) the second interlayer insulation film 13 is deposited on the second $SiO_2$ film 52, and holes are selectively formed in the interlayer insulation film 13 such that the holes are formed in the second $SiO_2$ film 52 or both of the second $SiO_2$ film 52 and the first $SiO_2$ film 51.

The first $SiO_2$ films 51 and 52 formed by the sputtering method as described above do not contain any hydrogen group and do not permit easy penetration of the hydrogen group. Even if the hydrogen group approaches the ferroelectric capacitor in the following process, it cannot be brought into directly contact with the ferroelectric capacitor. Therefore, deterioration in the characteristics of the ferroelectric member (the quantity of polarization) can be minimized.

Fourth Embodiment

FIG. 20 is a cross sectional view showing a semiconductor apparatus according to a fourth embodiment of the present invention. In this embodiment, there is provided a manufacturing method capable of manufacturing a semiconductor apparatus having a FRAM cell array, a logic circuit and the like consolidated therewith.

The manufacturing method according to this embodiment is characterized in that the contact plug formed from the first layer wiring in the double-layered wiring structure to the semiconductor substrate or the gate electrode of the transistor is formed in two steps. That is, the contact plug according to this embodiment is formed such that the lower portion is formed before the ferroelectric capacitor of the FRAM cell is formed, and then the residual upper layer portion is formed, after the ferroelectric capacitor is formed.

Since the contact plug is formed as described above, the ratio (the aspect ratio) of the depth of the contact hole with respect to the diameter of the opening portion of the contact hole can be reduced. Thus, the contact hole can easily be formed and embedding of the same can easily be performed. The foregoing fact is advantageous when consolidation with a logic product having a pattern layout in accordance with a very sever rule is performed.

The first half process of this embodiment is the same as that according to the second embodiment shown in FIG. 16. That is, the switching MOS transistor 31 of the memory cell and the MOS transistor 32 for the consolidation device other than the memory cell are formed on the semiconductor substrate 1.

The first bit line contact plug 33 connected to the drain/source region of the switching transistor 31, a first capacitor contact plug 34 and a first contact plug 35 to be connected to a source or drain region or a gate electrode of the other transistor 32 are embedded in the flattened first interlayer insulation film 10 covering the transistor.

A thin silicon nitride film layer 121 and a thin silicon oxide film layer 122 are formed on the surface of the first interlayer insulation film 10, as shown in FIG. 20. Moreover, the lower electrode 17, the ferroelectric film 18 and the upper electrode 19 are sequentially formed so that the ferroelectric capacitor is formed. The formed capacitor is covered with the second interlayer insulation film 13 having a flattened surface. Moreover, a second bit line contact plug 133, a second capacitor contact plug 134 and a second contact plug 135 connected to the other transistor 32 for the consolidated device are embedded in the second interlayer insulation film 13. Moreover, an upper electrode lead line 22, a bit line plug connection line 36 and a first layer wiring 37 are formed on the second interlayer insulation film.

The third interlayer insulation film 30 formed on the second insulation film 13 to cover the first wiring layer and having a flattened surface has via holes right above the bit line plug connection line 36 and the first layer wiring 37. The via holes are plugged by at least one material among Al, AlCu, AlSiCu, WSi, and Cu. Moreover, the second wiring layer 38 and the BL are formed on the surface of the third interlayer insulation film 30, and a passivation film 39 is formed on the second wiring layer 38 and the BL.

The manufacturing method according to this embodiment will sequentially be described. As described above, the first half process is the same as that according to the second embodiment (see FIG. 16). Similarly to the process for manufacturing a conventional CMOS type DRAM, the memory cell transistor 31 and the MOS transistor 32 for another device are formed on the semiconductor substrate 1. That is, the gate and the diffusion layer region of the transistor are formed, and the first interlayer insulation film 10 and contact holes are formed. Then, the contact plugs are embedded in the contact holes. As described above, this embodiment has the structure such that the contact plug is formed from the first wiring layer to the surface of the substrate in two steps. When the step shown in FIG. 16 has been performed, the first step (the lower layer portion) of forming the contact hole is completed.

Then, as shown in FIG. 20, a LPCVD method is employed so that the thin silicon nitride film layer 121 is formed on the first interlayer insulation film 10. The silicon nitride film layer 121 prevents oxidation of the material of the contact plug (for example, W) during annealing which is performed in the oxygen atmosphere in the process of forming the ferroelectric capacitor and prevents change in the characteristics of the transistor occurring due to annealing. Then, the thin silicon oxide film layer 122 is formed on the silicon nitride film layer 121 by a LPCVD method, a plasma CVD method or a normal pressure CVD method.

Then, TiN, Ti and Pt to form a conductive film for the capacitor lower electrode 17 are sequentially sputtered on the silicon oxide film layer 122. Then, a PZT film is formed to form the ferroelectric film 18 for the capacitor. Then, Pt is sputtered on the PZT film to form the upper electrode 19 for the capacitor. Then, RIE is employed to sequentially pattern the upper electrode 19, the capacitor insulation film 18 and the lower electrode 17 so that the ferroelectric capacitor is formed. If the ferroelectric film 18 is damaged and thus its characteristics are changed from its original characteristics at this time, the characteristics can be restored by performing annealing at about 500° C. in an oxygen atmosphere.

Then, plasma CVD is performed so that the second interlayer insulation film 13 is formed, and then the second interlayer insulation film 13 is flattened by CMP or the like. Then, contact holes for establishing the connection between the contact plugs 33, 34 and 35 and the second wiring layer to be formed later are formed. At this time, a contact hole (not shown) for establishing the connection between the capacitor lower electrode 17 and the first wiring layer is simultaneously formed.

Then, a sputtering method is employed to form a TiN film 111 on the overall surface to serve as a barrier layer, and then aluminum is deposited to plug the contact hole by a reflow method at about 400° C. Then, CMP or etching back is performed so that the TiN film and aluminum are removed in the portion other than the inside portion of the contact hole. Thus, both of the lower layer portion and the upper layer portion of the contact plug are formed so that the structure of this embodiment is completed.

Then, a contact hole is formed on the capacitor upper electrode 19 by RIE. Although also this contact hole may be formed simultaneously with the step for forming the above-mentioned contact hole and it may be plugged with aluminum or the like, the contact holes are not formed simultaneously in this embodiment. That is, the other contact holes are previously formed, and then this contact hole is formed. The reason for this is that the contact hole connected to the upper electrode and having a low aspect ratio as compared with the aspect ratios of the other contact holes is not considerably required to be plugged. Moreover, contact holes having different aspect ratios are considered to be difficult to simultaneously be plugged because their plugging conditions are different from each other. Moreover, the ferroelectric capacitor is required to be protected from being damaged when the plugging operation is performed.

Then, Ti, TiN, AlCu and TiN are sequentially deposited on the overall surface by a sputtering method so that a first wiring layer is formed. The first wiring layer is processed by RIE so that a capacitor connection wire 22 for establishing the connection between the capacitor contact plug 134 and the upper electrode 19, the bit line plug contact pattern 36 and the first layer wiring 37 for the consolidated device are formed. The TiN in the uppermost layer of the first wiring layer serves a reflection preventive film for preventing reflection of light from Al when a resist pattern is formed for lithography.

Then, the third interlayer insulation film 30 is formed, and its surface is flattened by CMP. Then, via holes for establishing the connection between the first wiring layer and a second wiring layer to be described later are formed. Then, an Al reflow method which has been used for the contact hole plugging of the second interlayer insulation film 13 is employed to plug the via hole with aluminum. Then, Ti, TiN and Al are sequentially sputtered so that the second wiring layer is formed. The second wiring layer is processed by RIE so that the second layer wiring 38, the bit line BL and the like are formed.

When a double-layered wiring structure device is manufactured, the top passivation film 39 is deposited, and the pad portion is selectively opened. When a device having a structure having more large number of wiring layers is manufactured, the foregoing method is repeated to form the wiring layer and the insulation layer. Finally, the top passivation film 39 is deposited, and then the pad portion is selectively opened.

Fifth Embodiment

Figure 21:
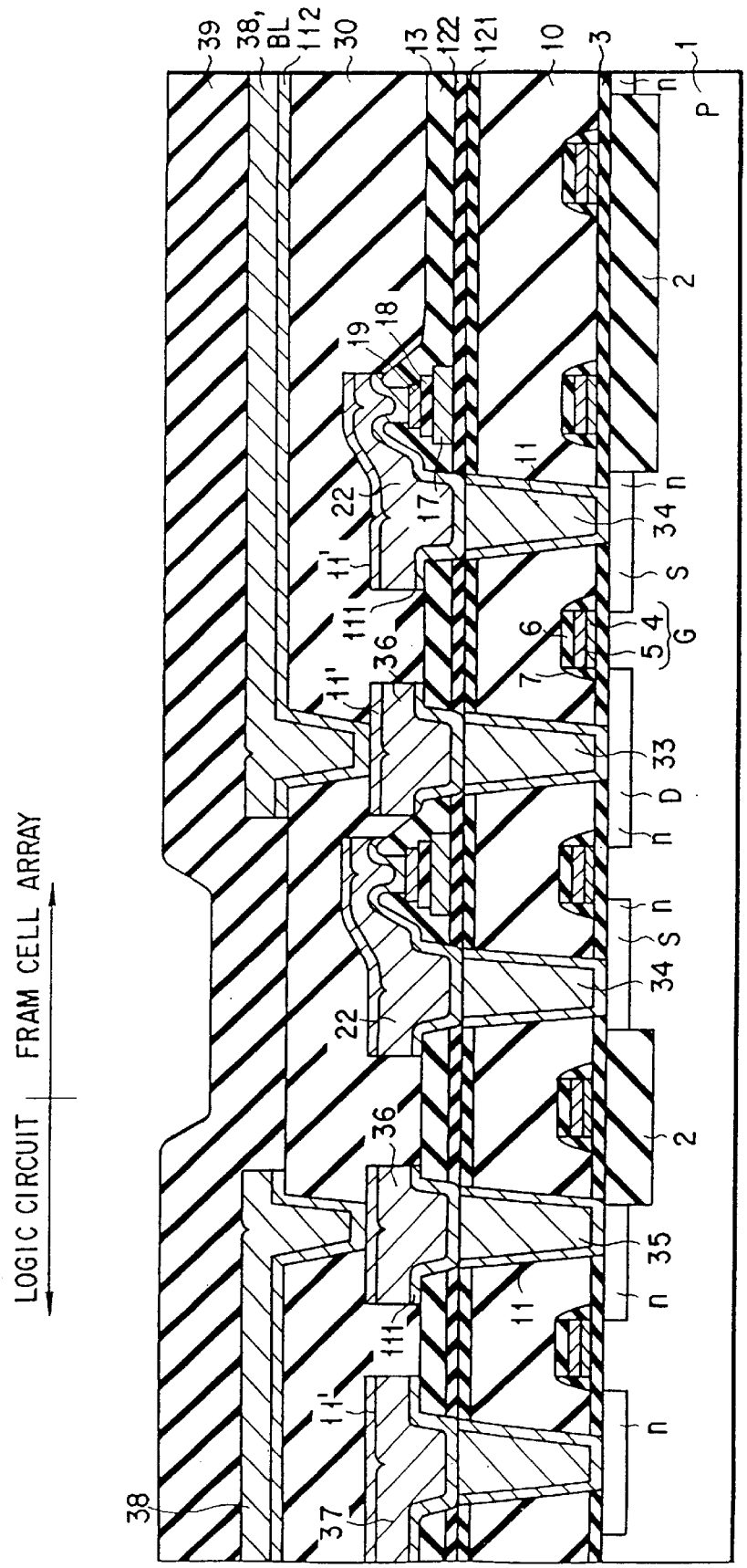
FIG. 21 is a cross sectional view of the FRAM cell for illustrating a method of manufacturing the FRAM cell array according to a fifth embodiment of the present invention.

FIG. 21 is a cross sectional view showing a semiconductor apparatus according to a fifth embodiment of the present invention. According to this embodiment, another structure preferable for a semiconductor apparatus having a FRAM cell array, a logic circuit and the like consolidated thereon and a method of manufacturing the same are provided. The structure is basically similar to the third embodiment. The same elements as those shown in FIG. 19 are given the same reference numerals and the same elements are omitted from description.

The first half process of the method according to this embodiment is similar to that according to the second embodiment described with reference to FIG. 16. That is, the switching transistor 31 of the memory cell, the other transistor 32 for the consolidated device other than the memory cell and the isolation oxide film 2 employing the STI (shallow trench isolation) are formed on the semiconductor substrate 1.

The silicon oxide film layer 10 is deposited to cover the above-mentioned transistors, and then the surface is flattened by employing the CMP method. Then, a $Si_xN_y$ film 121 is, by the LPCVD method, deposited to have a thickness of, for example, 150 nm (see FIG. 21). The $Si_xN_y$ film 121 protects the transistors from being damaged (prevents change in the threshold) during oxygen annealing which is performed when the ferroelectric capacitor is formed.

Then, a contact hole connected to the source region S and the drain region D of the transistor is formed by RIE. Ti and TiN are sequentially deposited by sputtering to form the barrier layer 11, and then the CVD method is employed to embed tungsten to form the contact plugs 33, 34 and 35. Then, Ti, TiN and W on the insulation film 10 are removed by, for example, the CMP method.

Then, a silicon oxide film layer ($SiO_2$) 122 is deposited on the overall surface to have a thickness of 100 nm. Then, the Pt layer 17, the PZT layer 18 and the PT layer 19 for forming the ferroelectric capacitor are sequentially deposited by sputtering. The deposited layers are subjected to heat treatment which is performed in oxygen so that the PZT layer is crystallized so as to be formed into a perovskite structure. Then, the foregoing layers are processed by RIE to have the shape of the capacitor.

Then, the silicon oxide film 13 is deposited on the overall surface by the plasma CVD method, and then opening portions are formed above the contact plugs 33, 34 and 35 and the upper electrode 19. Then, Ti and TiN for forming the barrier layer 111, Al for forming the wiring layers 22, 36 and 37 and W for forming the barrier layer 11' are sequentially deposited on the overall surface by sputtering, and then processed by RIE. Thus, a first wiring layer is formed which includes an electric wire for establishing the connection between the capacitor and the contact plug 34, an outlet electrode of the contact plug and the like.

Then, a silicon oxide film layer 30 is deposited on the overall surface by the plasma CVD method. An opening portion is formed in the silicon oxide film layer 30 right above the contact plugs 33 and 35 so that a portion of the first wiring layer corresponding to the portion given reference numeral 36 is exposed. Then, Ti and TiN for forming the barrier layer 112 and Al for forming the wiring 38 are sequentially deposited by sputtering. Then, heat treatment is performed at about 400° C. so that Al is allowed to reflow so that an opening portion formed in the silicon oxide film 30 and having a high aspect ratio is filled up. The reason why tungsten is not used in the filling up operation by the CVD method, the ferroelectric capacitor must be protected from being damaged by hydrogen. Use of Al reflowing is able to prevent generation of hydrogen, and thus the ferroelectric capacitor can be protected from being damaged.

Then, the Ti, TiN and Al layers are processed by RIE so that a second wiring layer is formed. Then, the silicon oxide film 39 is deposited by the CVD method so that the semiconductor apparatus shown in FIG. 21 is manufactured.

Sixth Embodiment

Figure 22:
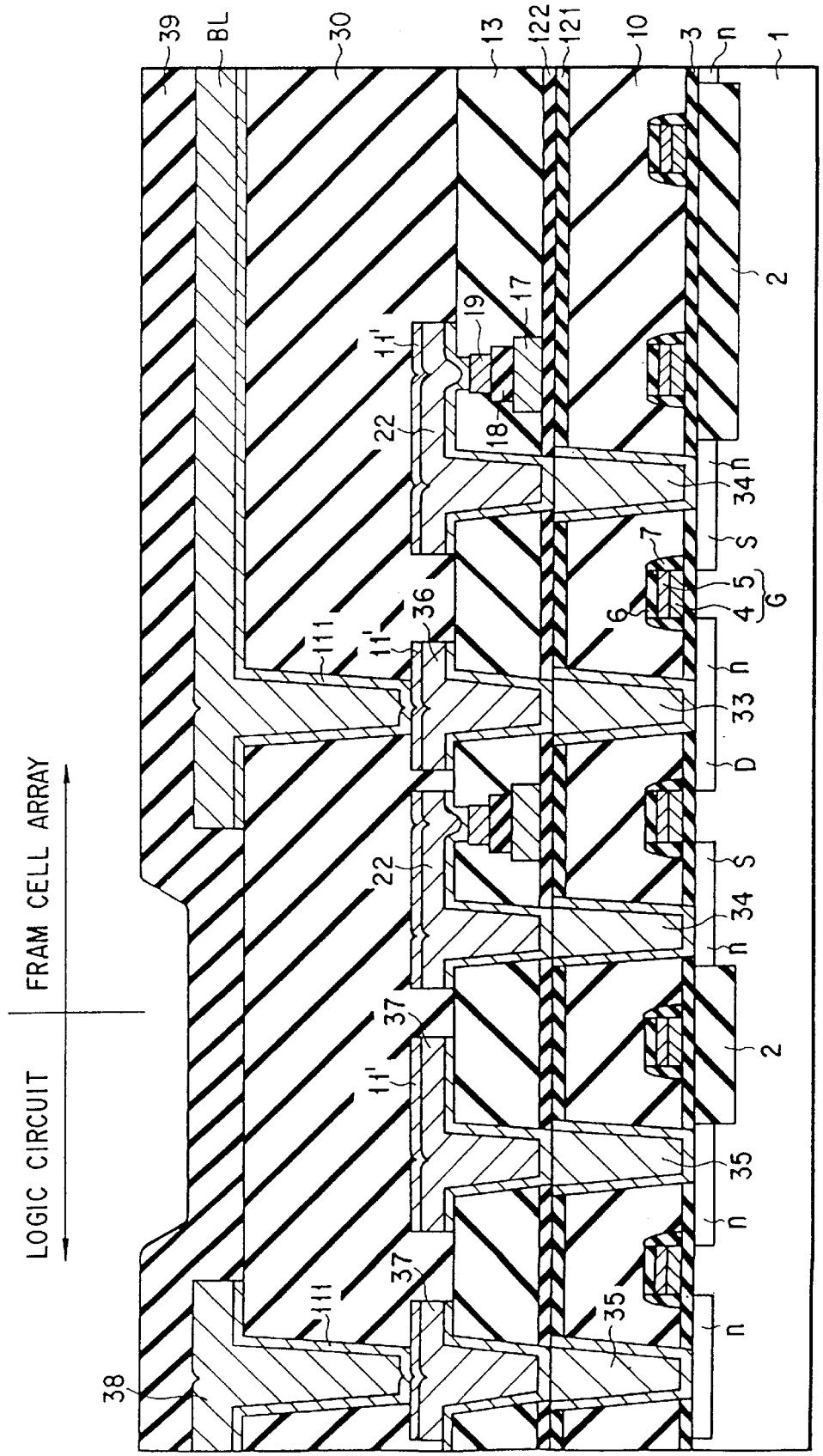
FIG. 22 is a cross sectional view of the FRAM cell for illustrating a method of manufacturing the FRAM cell array according to a sixth embodiment of the present invention.

FIG. 22 is a cross sectional view showing a semiconductor apparatus according to a sixth embodiment of the present invention. According to this embodiment, there are provided another structure preferable for a semiconductor apparatus having the FRAM cell array, logic circuit and the like consolidated thereon and a manufacturing method therefor. This embodiment is basically similar to the fourth embodiment. The same elements as those shown in FIG. 20 are given the same reference numerals, and the same elements are omitted from description.

The process until the silicon oxide film 122 is formed is performed similarly to that according to the fifth embodiment. Then, the Pt layer 17, the PZT layer 18 and the Pt layer 19 for forming the ferroelectric capacitor are sequentially deposited on the overall surface by sputtering. The above-mentioned layers are subjected to a heat treatment in oxygen so that the PZT layer is crystallized to have the perovskite structure. Then, the above-mentioned layers are processed by RIE to have the shape of the capacitor.

Then, the silicon oxide film 13 is deposited on the overall surface by the plasma CVD method, and then opening portions are formed above the contact plugs 33, 34 and 35. Then, Ti and TiN for forming the barrier layer 111 and Al for forming the wiring layers 22, 36 and 37 are sequentially deposited on the overall surface by sputtering, and then heat treatment is performed to allow Al to reflow. Thus, the above-mentioned opening portions are filled up. Then, tungsten for forming the barrier layer 11' is deposited by the CVD method. The above-mentioned Ti, TiN, Al and W layers are processed by RIE so that the first wiring layer including via contacts with the contact plugs 33, 34, 35 and the like is formed. This embodiment is characterized in that the opening portion (the via hole) formed in the silicon oxide film layer 13 is filled up by Al allowed to reflow.

Then, the silicon oxide film layer 30 is deposited on the overall surface by the plasma CVD method. An opening portion is formed in the silicon oxide film layer 30 right above the drain region D of the transistor so that the tungsten layer 11' on the corresponding first wiring layers 36 and 37 is exposed. Then, a process similar to that according to the fifth embodiment is performed so that Ti and TiN forming the barrier layer 111 and Al forming the electric wire 38 are sequentially deposited by sputtering. Then, a heat treatment is performed at about 400° C. so that Al is allowed to reflow. Thus, the opening portion (the via hole) formed in the silicon oxide film 30 and having a high aspect ratio is filled up. The tungsten layer 11' formed on the first wiring layer prevents melting of Al in the first wiring layer when Al in the second wiring layer is allowed to reflow.

Then, the Ti, TiN and Al layers are processed by RIE so that the second wiring layer is formed. Then, the silicon oxide film 39 is deposited by the CVD method so that the semiconductor structure shown in FIG. 22 is formed.

Seventh Embodiment

Figure 23:
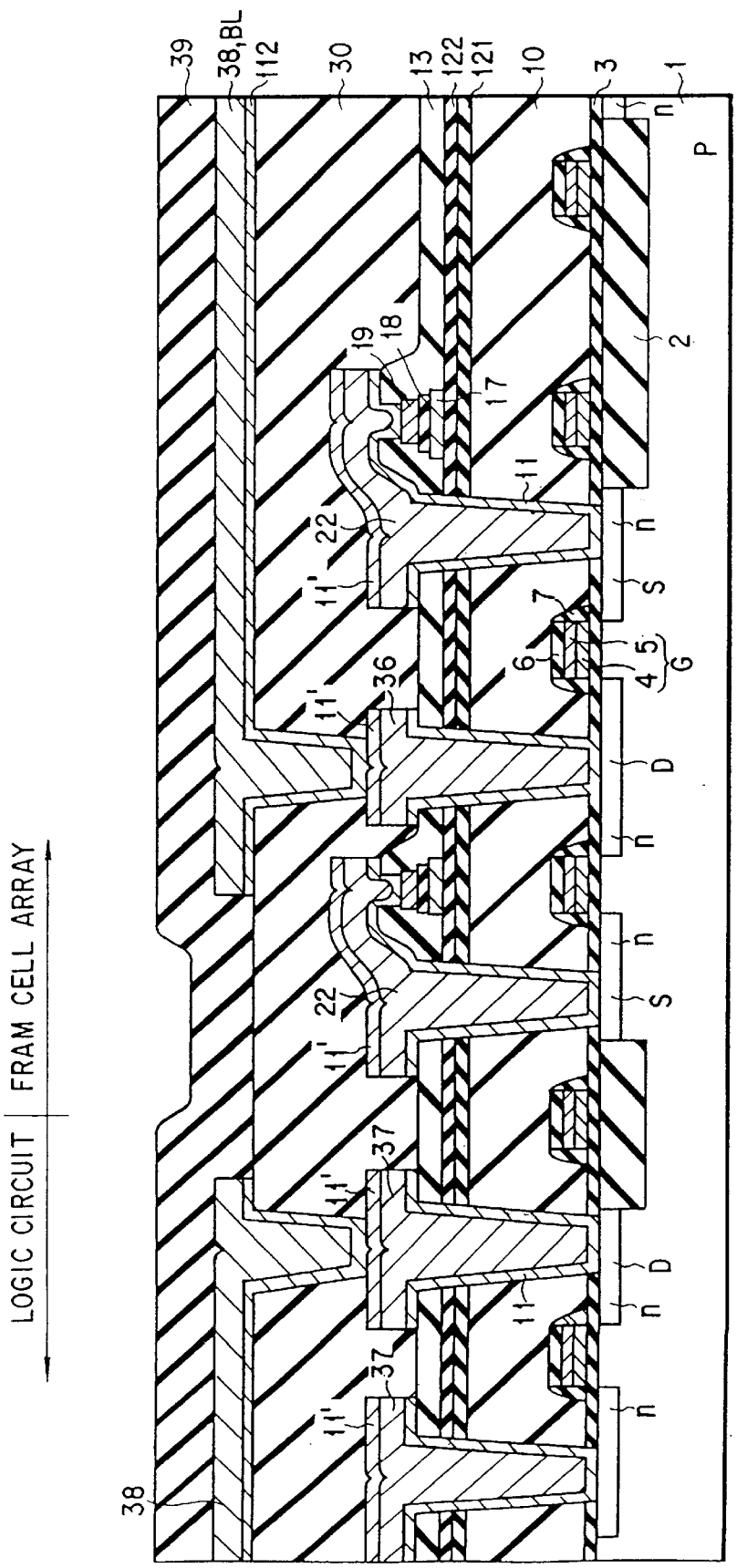
FIG. 23 is a cross sectional view of the FRAM cell for illustrating a method of manufacturing the FRAM cell array according to a seventh embodiment of the present invention.

FIG. 23 is a cross sectional view showing a semiconductor apparatus according to a seventh embodiment of the present invention. According to this embodiment, there are provided another structure preferable for a semiconductor apparatus having the FRAM cell array, a logic circuit and the like consolidated thereon and a manufacturing method therefor. The structure of this embodiment is basically similar to that according to the third embodiment. The same elements as those shown in FIG. 19 are given the same reference numerals and the same elements are omitted from description.

The first half process of this embodiment is substantially the same as that according to the second embodiment described with reference to FIG. 16. That is, the switching transistor 31 of the memory cell, the other transistor 32 for the consolidated device other than the memory cell and the isolation oxide film 2 using STI are formed on the semiconductor substrate 1.

The silicon oxide film layer 10 is deposited to cover the above-mentioned transistors, and the surface is flattened by using the CMP method. Then, the $Si_xN_y$ film 121 is deposited on the flattened surface by the LPCVD method to have a thickness of, for example, 150 nm (see FIG. 23). The $Si_xN_y$ film 121 protects the transistor from being damaged (prevents change in the threshold) owning to oxygen annealing which is performed when the ferroelectric capacitor is formed.

Then the silicon oxide film layer ($SiO_2$) 122 is deposited on the overall surface to have a thickness of 100 nm. Then, the Pt layer 17, the PZT layer 18 and the Pt layer 19 for forming the ferroelectric capacitor are sequentially deposited on the,silicon oxide film layer 122 by sputtering. The above-mentioned layers are subjected to a heat treatment which is performed in oxygen so that the PZT layer is crystallized so as to be formed into the perovskite structure. Then, the above-mentioned layers are processed to have the shape of the capacitor by RIE.

Then, the silicon oxide film 13 is deposited on the overall surface by the plasma CVD method, and then contact holes connected to the source region S and the drain region D of the transistor are formed by the RIE. Ti and TiN for forming the barrier layer 11 and Al for forming the electric wires 22, 36 and 37 are sequentially deposited by sputtering. Then, a heat treatment at about 400° C. is performed so that Al is allowed to reflow. Thus, the contact holes are filled up. Then, the CVD method is employed to deposit tungsten for forming the barrier layer 11'. The Ti, TiN, Al and W layers are processed by the RIE so that the first wiring layer including the contacts with the source region S and the drain region D of the transistor is formed. This embodiment is characterized in that the opening portions (the contact holes) formed through the insulation layers 10, 121, 122 and 13 are filled up by Al allowed to reflow.

Then, the silicon oxide film layer 30 is deposited on the overall surface by the plasma CVD method, and then flattened by the CMP. An opening portion is formed in the silicon oxide film layer 30 right above the drain region D of the transistor so that the tungsten layer 11' on the corresponding first wiring layers 36 and 37 is exposed. Then, a process similar to the fifth embodiment is performed so that Ti and TiN for forming the barrier layer 112 and Al for forming the electric wire 38 are sequentially deposited by sputtering. Then, a heat treatment is performed at about 400° C. so that Al is allowed to reflow so that the opening portion formed in the silicon oxide film 30 and having a high aspect ratio is filled up. The tungsten layer 11' formed on the first wiring layer prevents melting of Al in the first wiring layer when Al in the second wiring layer is allowed to reflow.

Then, the Ti, TiN and Al layers are processed t by RIE so that the second wiring layer is formed. Then, the silicon oxide film 39 is deposited by the CVD method so that the semiconductor structure shown in FIG. 23 is manufactured.

Eighth Embodiment

Figure 24:
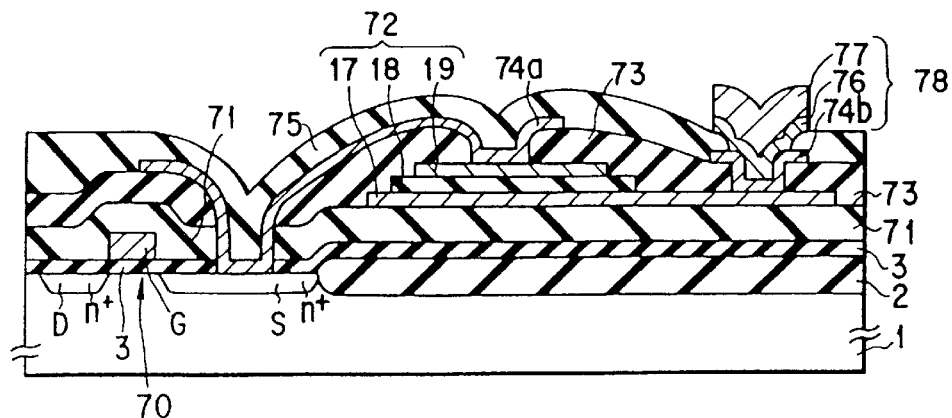
FIG. 24 is a cross sectional view of the FRAM cell for illustrating a method of manufacturing the FRAM cell array according to a eighth embodiment of the present invention.
Figure 26:
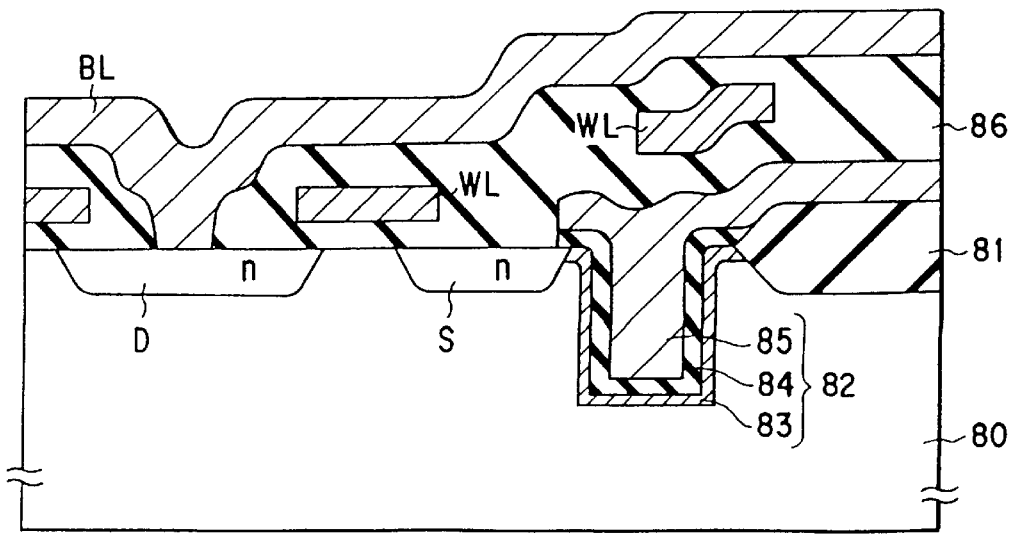
FIG. 26 is a cross sectional view showing the structure of a DRAM cell according to a modification of the eighth embodiment of the present invention.

An eighth embodiment of the method of manufacturing the semiconductor apparatus according to the present invention will now be described. In this embodiment, a method of manufacturing a ferroelectric film and an electrode film of a charge storing capacitor of a FRAM cell as shown in FIG. 24, or a manufacturing method capable of raising the density of a ferroelectric film and an electrode film for the charge storing capacitor for a DRAM cell as shown in FIG. 26 and improving the reliability of the same will now be described. This embodiment is sectioned into a plurality of sub-embodiments having different processes and conditions.

In these sub-embodiments, a capacitor is formed which comprises a dielectric film composed of a complex oxide film containing at least two or more types of metal elements between a pair of electrodes, and a semiconductor is manufactured in which an insulation oxide film and a wiring layer are laminated on the foregoing capacitor such that (a) The step of forming the capacitor includes a step of forming a first electrode, a step of forming a dielectric film, a step of performing a RTA process under a condition that the pressure is lowered to 0.5 Torr (=0.5×133, 322 Pa) or higher and 500 Torr or lower, and a step of forming a second electrode.

(b) The step of forming the capacitor includes a step of forming a first electrode, a step of forming a dielectric film, a step of performing a second electrode, and a step of performing a RTA process under a condition that the pressure is lowered to 0.5 Torr or higher and 500 Torr or lower.

(c) The step of forming the capacitor includes a step of forming a first electrode, a step of performing a RTA process under a condition that the pressure is lowered to 0.5 Torr or higher and 500 Torr or lower, a step of forming a dielectric film, and a step of forming a second electrode.

(d) In any one of the steps (a) to (c), a complex oxide film containing at least two or more types of metal elements is formed on the first electrode by a sputtering method, a CVD method or a LSMCD (Liquid Source Misted Chemical Deposition) method.

(e) In any one of steps (a) to (c), the RTA process to be performed under the lowered pressure is performed under a divided pressure of oxygen of 0.5 Torr or higher and 500 Torr or lower.

(f) In any one of steps (a) to (c), the RTA process to be performed under the lowered pressure is performed under a partial pressure of ozone of 0.5 Torr or higher and 500 Torr or lower.

(g) In any one of steps (a) to (c), the RTA process is performed in an atmosphere in which the partial pressure ratio of ozone is 1% or higher.

The RTA process is heat treatment in which the temperature raising rate is 10° C./second or higher. The heat raising ratio is able to considerably improve the crystalline characteristic of the film. In particular, a lead-based dielectric film made of, for example, PZT is enabled to prevent generation of pyrochlore phase having a low dielectric constant. Thus, an advantage is realized in crystallization. Since the heat treatment using RTA is arranged to quickly raise the temperature, it has a problem in which crystallization is performed in a state where volatilization of introduced gas is insufficient.

Since the method of forming a dielectric film according to the sub-embodiment is arranged such that the RTA process is performed under reduced pressure of 0.5 Torr or higher and 500 Torr or lower, crystallization is performed in a state where residual gas introduced into the deposition film is removed. Therefore, a dielectric film having excellent crystallization characteristic at a high density can be obtained. When the dielectric film is crystallized, also the electrode film is crystallized. However, the gas introduced into the electrode film can be removed by the above-mentioned heat treatment so that the resistance of the electrode film is lowered.

Although the RTA process enhances the crystallization, there is a risk that the dielectric film is formed into a semiconductor structure if supply of oxygen is insufficient. In particular, a Pb-based dielectric film such as PZT, and barium titanate, can easily be formed into a semiconductor structure and the resistance of the film is considerably lowered.

It is preferable that the heat treatment be performed in this case such that annealing is, under lowered pressure, performed in a partial pressure of oxygen of 0.5 Torr or higher and 500 Torr or lower. If supply of oxygen is insufficient, the resistance of a conductive oxide film, such as $IrO_2$, $RuO_2$, ITO or $SnO_2$, is changed excessively and thus the characteristic becomes instable. Therefore, annealing in the above-mentioned partial pressure of oxygen is effective.

If the annealing is performed under the partial pressure of ozone of 0.5 Torr or higher and 500 Torr or lower, leak currents from the film can be reduced. The foregoing fact is important when a capacitor of a memory, such as a DRAM, which must be refreshed is formed. The electric power consumption can be reduced.

The RTA process under low pressure is effective when a sputtering method, a CVD method or a LSMCD method is employed to form, on the first electrode, a dielectric film composed of a complex oxide film containing at least two types of metal elements. The reason for this is that the influence of the introduced gas cannot be prevented when the film is formed by the above-mentioned film forming method.

Although a sol/gel method or MOD method may be employed to form the dielectric film according to the sub-embodiment, a quantity of volatilization of organic groups is too large. Therefore, if the heat treatment is started under the lowered pressure, the surface of the film will be roughened. It is preferable that heat treatment be performed at 350° C. or higher under the atmospheric pressure and then the RTA process be performed under lowered pressure.

The ozone annealing method and its effect will now be described. The ozone annealing process is performed such that mixed gas of ozone and oxygen generated by an ozone generator is introduced into a heat processing portion heated to 100° C. to 400° C. For example, the mixed gas of ozone and oxygen is introduced in a state where the rear side of the wafer is heated to 300° C. Then, the heat processing portion is irradiated with a low level mercury light with 100 mW/cm² for 30 minutes to 200 minutes. The effective wavelength of mercury light is 320 nm or shorter.

When the heat treatment is performed in an atmosphere of the mixed gas in which the partial pressure ratio of ozone of 1% or higher, intrinsic oxygen voids when the film is formed can be reduced. Thus, the leak current can be reduced. When heat treatment is performed afterwards at 600° C. higher in oxygen, dispersion in the wafer plane can be reduced more effectively. The sub-embodiments of the specific contents of the fifth embodiment will now be described.

[Sub-Embodiment 8A]

FIG. 24 is a cross sectional view showing a FRAM cell having the capacitor formed by the manufacturing method according to the eighth embodiment of the present invention.

The FRAM cell according to the sub-embodiment 8A is manufactured as follows: initially, an isolation film 2 is formed on the semiconductor substrate 1 by LOCOS. Then, a diffusion layer for the source region S/drain region D, the gate insulation film 3 and the gate electrode G are formed so that a MOS transistor 70 is formed. Then, a CVD method is employed so that an interlayer insulation film 71 of $SiO_2$ is deposited.

Then, an information storing capacitor 72 of the memory cell is formed. Initially, a lower electrode film composed of Ti/Pt is deposited on the interlayer insulation film 71 by continuous DC sputtering in an atmosphere of Ar having pressure of 2.5 mTorr.

Then, a PZT film is formed by RF sputtering in an atmosphere of Ar having a pressure of 2.5 mTorr. Three types of samples respectively having the thicknesses of the PZT film of 180 nm, 210 nm and 240 nm are formed. Then, a first RTA process is performed for 10 seconds at 800° C. at a temperature rising rate of 100° C./second in an atmosphere of oxygen having pressure of 10 Torr. Then, a Pt film serving as the upper electrode film is formed on the PZT film by DC sputtering. Then, a diffusion furnace is operated so that second annealing is performed slowly at 600° C.

Then, the laminated lower electrode film, the PZT film and the upper electrode film are etched by RIE so as to be patterned into required forms so that a capacitor 72 composed of the lower electrode film 17, the dielectric film 18 and the upper electrode 19 is formed. Then, etching damage is restored by third annealing which is performed slowly at 600° C. in the diffusion furnace.

Then, an insulation film 73 is deposited to cover the capacitor 72 by the CVD method, and then RIE is employed to form a contact hole for exposing either the source S/drain D of the MOS transistor 70 and a portion of each of the upper electrode 19 and the lower electrode film 17 of the capacitor 72 by etching. Then, the diffusion furnace is operated so that fourth annealing is performed slowly at 600° C.

Then, an internal electric wire 74*a* for establishing the connection between either the source S/drain region D of the MOS transistor 70 and the upper electrode 19 and an internal electric wire 74*b* serving as an outlet electrode from the lower electrode film 17 are formed. Then, a passivation film 75 is deposited on the overall surface of the device. Then, RIE is employed so that a contact hole is formed in the passivation film 75, and then an aluminum electric wire 77 is formed on the electrode 74b with the barrier layer 76 interposed therebetween. The gate electrode G of the MOS transistor 70 is used as the word line, while the internal electric wire 74b, the barrier layer 76 and the aluminum electric wire 77 are used as the plate lines.

The first annealing process among the four times of the annealing processes is heat treatment for crystallize the dielectric film, the second annealing process is heat treatment for making the state of the interface between the dielectric film 18 and the upper electrode 19 to be the same as that between the lower electrode film 17 and the dielectric film 18, and the third and fourth annealing processes are performed to restore the process damage.

The foregoing embodiment is described as sub-embodiment 8A and sub-embodiments corresponding to the thicknesses of the PZT films of 180 nm, 210 nm and 240 nm are described as sub-embodiments 8A(1), 8A(2) and 8A(3).

Sub-embodiments having varied processing conditions are described as sub-embodiments 8B to 8F. The varied thicknesses of the dielectric films are classified by added suffices (1), (2) and (3) in an ascending order of the thickness. Two types of comparative examples are manufactured which are described as comparative examples CA and CB.

[Sub-Embodiment 8B]

Sub-embodiment 8B is performed such that the information storing capacitor 72 shown in FIG. 24 is formed as follows. A lower electrode film made of Ti/Pt is formed on the interlayer insulation film 71 by continuous DC sputtering in an atmosphere of Ar having pressure of 2.5 mTorr. Then, a PZT film is formed by RF sputtering under a condition that the temperature of the substrate is 500° C. in an atmosphere of $Ar/O_2$. A Pt film is formed on the PZT film, and then first RTA annealing is performed in oxygen having pressure of 10 Torr. The temperature is raised at a rate of 100° C./second. After the temperature has been raised to 800° C., this temperature level is retained for 10 seconds.

[Sub-Embodiment 8C]

Sub-embodiment 8C is performed such that the information storing capacitor 72 shown in FIG. 24 is formed as follows. A lower electrode film made of Ti/Pt is formed on the interlayer insulation film 71 by continuous DC sputtering in an atmosphere of Ar having pressure of 2.5 mTorr. First RTA annealing is performed in oxygen having pressure of 10 Torr. The temperature is raised at a rate of 100° C./second. After the temperature has been raised to 800° C., this temperature level is retained for 10 seconds. Then, a PZT film is formed by RF sputtering under a condition that the temperature of the substrate is 500° C. in an atmosphere of Ar having pressure of 2.5 mTorr. Then, a Pt film is formed on the PZT film, and then second annealing is performed slowly at 600° C. in the diffusion furnace.

[Sub-Embodiment 8D]

Sub-embodiment 8D is performed such that the information storing capacitor 72 shown in FIG. 24 is formed as follows. Initially, an Ir resinate is rotation-applied to the surface of the interlayer insulation film 71, and then heat treatment is performed at 800° C. in an atmosphere of 760 Torr so that a lower electrode film made of $IrO_2$ is formed. Then, a SBT (strontium bismuth tantalate) film is formed by a LSMCD method such that a mixed raw material of organic metal compounds is formed into mist so as to be deposited on a rotating substrate. Then, heat treatment is previously performed at 450° C. in an atmosphere of 760 Torr, and then RTA annealing is performed for 10 seconds at 800° C. in an atmosphere of oxygen having pressure of 500 Torr at a temperature raising rate of 50° C./second. Then, an Ir resinate is again spin-coated to the surface of the SBT film, and then heat treatment is performed at 800° C. in an atmosphere of 760 Torr so that the upper electrode made of $IrO_2$ is formed.

[Sub-Embodiment 8E]

Sub-embodiment 8E is performed such that the information storing capacitor 72 shown in FIG. 24 is formed as follows. Initially, an Ir resinate is rotation-applied to the surface of the interlayer insulation film 71, and then heat treatment is performed at 800° C. in an atmosphere of 760 Torr so that a lower electrode film made of $IrO_2$ is formed. Then, a SBT film is formed by an LSMCD method. Then, heat treatment is previously performed at 450° C. in an atmosphere of 760 Torr, and then RTA annealing is performed for 10 seconds at 800° C. in a mixed atmosphere of ozone by 10% and oxygen by 90% under pressure of 5 Torr at a temperature raising rate of 80° C./second. Then, an Ir resinate is again spin-coated to the surface of the SBT film, and then heat treatment is performed at 800° C. in an atmosphere of 760 Torr so that the upper electrode made of $IrO_2$ is formed.

[Sub-Embodiment 8F]

Sub-embodiment 8F is performed such that the information storing capacitor 72 shown in FIG. 24 is formed as follows. A lower electrode film made of Ti/Pt is formed on the interlayer insulation film 71 by continuous DC sputtering in an atmosphere of Ar having pressure of 2.5 mTorr. Then, a PZT film is formed by RF sputtering in an atmosphere of Ar having pressure of 2.5 mTorr. First RTA annealing is performed for 10 seconds at 800° C. in an atmosphere of oxygen having pressure of 10 Torr at a temperature raising rate of 100° C./second. Then, a Pt film is formed on the PZT film by DC sputtering, and then second annealing is performed slowly at 550° C. in a mixed atmosphere of ozone by 10% and oxygen by 90% in the diffusion furnace.

[Comparative Example CA]

Comparative example CA is performed such that the information storing capacitor shown in FIG. 24 is formed as follows. A lower electrode film made of Ti/Pt is formed on the interlayer insulation film by continuous DC sputtering in an atmosphere of Ar having pressure of 2.5 mTorr. Then, a PZT film is formed by RF sputtering in an atmosphere of Ar having pressure of 2.5 mTorr. First RTA annealing is performed for 10 seconds at 800° C. in an atmosphere of oxygen having pressure of 760 Torr at a temperature raising rate of 100° C./second. Then, a Pt film is formed on the PZT film by DC sputtering, and then second annealing is performed slowly at 600° C. in the diffusion furnace.

[Comparative Example CB]

Comparative example CB is performed such that the information storing capacitor shown in FIG. 24 is formed as follows. Initially, an Ir resinate is spin-coated to the surface of the interlayer insulation film, and then heat treatment is performed at 800° C. in an atmosphere of 760 Torr so that a lower electrode film made of $IrO_2$ is formed. Then, an LSMCD method is employed so that a PZT film having a thickness of 180 nm is formed. Then, a heat treatment is previously performed at 450° C. in an atmosphere of 760 Torr, and then RTA annealing is performed for 10 seconds at 800° C. in an atmosphere of oxygen having pressure of 760 Torr at a temperature raising rate of 50° C./second. Then, an Ir resinate is again spin-coated to the surface of the PZT film, and then heat treatment is performed at 800° C. in an atmosphere of 760 Torr so that the upper electrode made of $IrO_2$ is formed.

[Evaluation of Sub-Embodiments and Comparative Examples]

Figure 25:
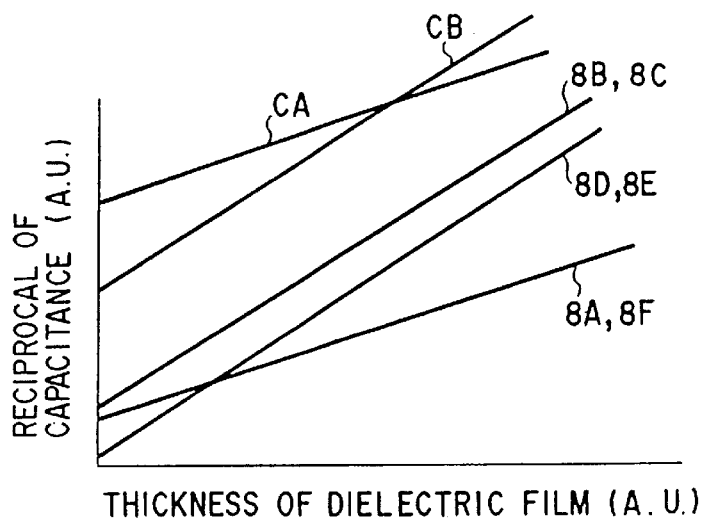
FIG. 25 is a graph showing the characteristics of capacitors according to sub-embodiments of the eighth embodiment and comparative examples.

FIG. 25 is a graph showing the relationship between the film thickness (the thickness of the dielectric film) and the reciprocal (1/C) of capacitance C obtained by measuring the capancitance of each of the capacitors according to the sub-embodiments 8A–8F and comparative examples CA and CB.

Capacitance C, dielectric constant $\in$ of the dielectric member and thickness t of the dielectric member satisfy the following relationship:

$$C = \in_0 \times \in \times S/t$$

here $\in_0$ is dielectric constant of the vacuum and S is the area of the electrode. The foregoing relationship can be transferred as follows:

$$1/C = k \times (1/\in) \times t$$

where k is a constant expressed as $k=1/(\in_0 \times S)$. In actual, a straight line expressed as follows is formed:

$$1/C = k \times (1/\in) \times t + n$$

Assuming that n=1/C', a circuit in which capacitors for C' are connected in series is considered.

As can be understood from FIG. 25, the eighth embodiment (sub-embodiments 8A–8F) of the present invention results in the capacitor component corresponding to C' is small. As can be understood from this, no excessive low dielectric constant layer exists in the interface with the electrode and thus a dielectric film with which the thickness can be reduced has been formed.

On the other hand, each of comparative examples CA and CB have a large capacitor component corresponding to C'. In this case, a sufficiently large capacitance cannot be obtained and the thickness cannot be reduced. To operate a device with a low voltage level, the dielectric member must be used in a sufficiently saturated region, that is, the thickness must be reduced and a large electric field must be applied. However, existence of C' of the low dielectric constant in the interface hinders reduction in the thickness.

The cross section of the dielectric portion of each of sub-embodiments 8A–8F and comparative examples CA and CB was observed by a transmissive type electronic microscope. A multiplicity of large voids having size corresponding to 1/10 to 1/5 of the thickness were observed in the interface between the dielectric member and the electrode. The embodiments of the present invention had very small number of voids. A fact was found that the voids lowered the density of a portion of the film and formed a low dielectric constant layer.

Moreover, the operation speed and the fatigue resistance of each device were examined. Sub-embodiment 8C resulted in the highest operation speed. In particular, no defective bit was generated even the writing period was shortened to 140 ns. The other sub-embodiments encountered defective bits in the reliability test if the writing time as lower than 150 ns. Although sub-embodiments 8D and 8E enabled the number of rewriting times of $10^{12}$ to be realized. However, the other sub-embodiments encountered defective bits when the rewriting times was $10^{10}$. When samples was allowed to stand for a long time after a fatigue test of $10^7$ times to examine an inprint characteristic. Sub-embodiments 8E and 8F were free from defective bits.

[Other Embodiment (Modification)]

In the process of forming a trench type DRAM cell shown in FIG. 26, an isolation region 81, source S/drain region D region of a MOS transistor for a transfer gate of a memory cell, and a trench structure capacitor 82 of the memory cell are formed on a semiconductor substrate 80. The capacitor 82 was formed such that Ru in the lower electrode 83 was formed by DC sputtering, and then a BST (Barium Strontium Titanate) film 84 was formed as a deposited film having a thickness of 100 nm by a CVD method using an organic metal compound as a row material source and an Ar carrier gas such that the temperature of the substrate was raised to 450° C. Then, RTA annealing was performed at 600° C. in an atmosphere in which the partial pressure of $N_2$ was 450 Torr. Then, Ru for forming the upper electrode was formed by DC sputtering so that a 3-dimensional laminate was formed. Then, a $SiO_2$ insulation film 86, word lines WL and bit lines BL were formed so that a DRAM was formed. In this case, a precise BST dielectric film having a dielectric constant of 250 was obtained.

Figure 27A:
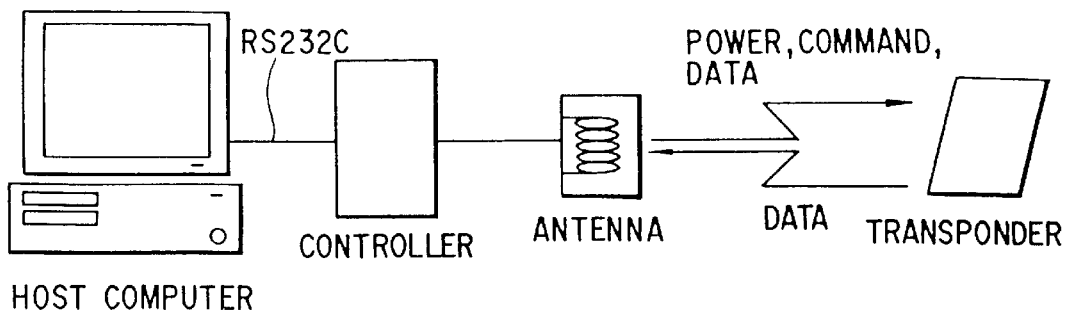
FIG. 27A is a structural view showing a RF-ID system to which the FRAM is applied.
Figure 27B:
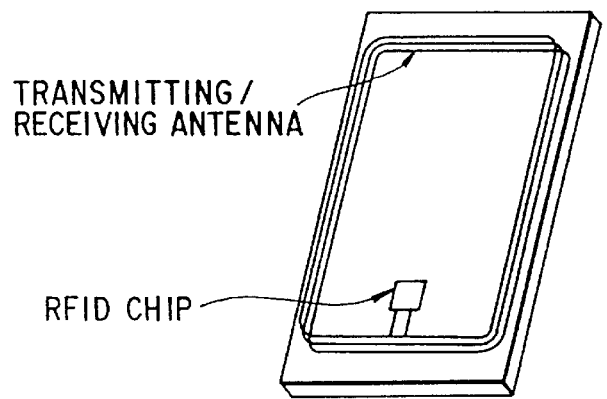
FIG. 27B is schematic structural view showing a transponder for use in the RF-ID system.
Figure 27C:
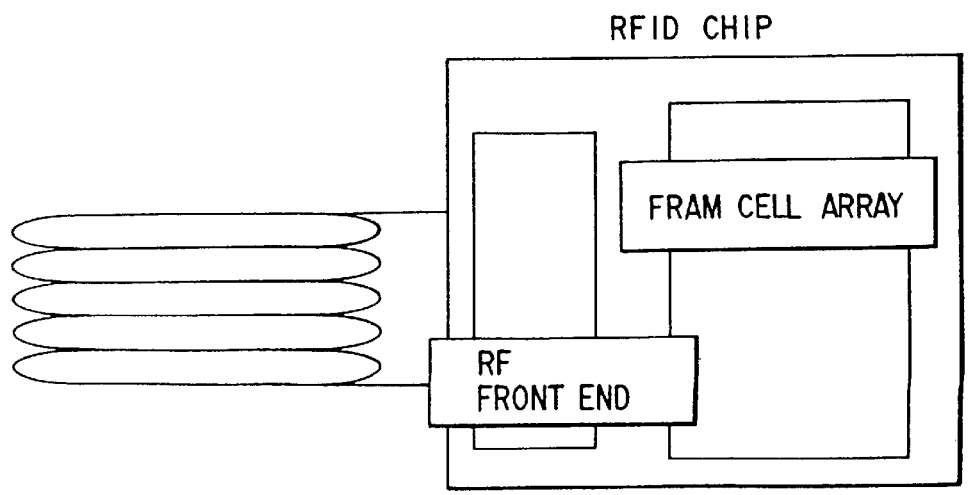
FIG. 27C is a schematic view showing the internal structure of an RF-ID chip for use in the transponder.

An example in which the above-mentioned FRAM is applied to a RF-ID system will now be described. The RF-ID system is a non-contact tag system (an identifier) using electric waves. In general, the system is also called a non-contact data carrier system. The structure of the RF-ID system is shown in FIGS. 27A–27C.

The RF-ID system is composed of a host portion comprising a personal computer, a controller, an antenna and so forth and a data carrier called as a transponder. The transponder has a simple structure including a monlolithic RF-ID chip in which the FRAM and ASIC (application specified integrated circuit) are formed into one chip and an antenna also receiving electric power and transmitting/receiving data.

The host portion transmits commands and data on carrier waves when required. The transponder portion generates required electric power with the foregoing carrier waves to use it to write/read data and transmit data so as to return information to the host portion.

The non-contact tag does not need any battery and has a structure such that the contents stored in the FRAM are read in a non-contact manner by using electric waves and the contents are rewritten so as to be used to manage inlet and outlet of persons. For example, inlet and outlet are permitted in a state where the non-contact tag serving as a commutation ticket is held in a pocket of clothes, or the non-contact tag is attached to a vehicle to eliminate the necessity for the vehicle to step at a toll gate of a highway for payment. Moreover, the inlet/outlet to and from a parking is supervised/managed without a necessity of a human being. Moreover, it can be used to manage the movement of domestic animals or migratory fishes.

FIG. 28 shows the detailed structure of an internal circuit of the transponder. The transponder comprises a plurality of memory cells disposed in rows and columns, the memory cell being composed of an LC circuit for detecting electromagnetic waves supplied from outside, a circuit 58 for generating a signal from the electromagnetic wave detected by the LC circuit, a circuit 59 for generating power supply voltage from the electromagnetic wave detected by the LC circuit, a power-on circuit 60 for detecting first transition of the power supply voltage to output a power-on signal, a ferroelectric capacitor having the ferroelectric substance between electrodes thereof and a charge transferring MOS transistor, and a FRAM cell array 61 structured such that, for example, the MOS transistors in the memory cells on the same row are commonly connected by the same word line, one of the electrodes of the ferroelectric capacitors of the memory cells of the same rows is commonly connected by the same capacitor plate line, and one of the terminals of the MOS transistors of the memory cells of the columns are commonly connected by the same bit line.

As described above, the FRAM enables a new management system to be practically used.

The method of manufacturing the FRAM according to the present invention is not limited to the above-mentioned FRAM. The present invention may be applied to a method of forming a ferroelectric memory cell which is, though in a small quantity, used in a logic program storage portion of a logic LSI or the like having the FPGA (Field Programmable Gate Array) or a static RAM mounted thereon.

The present invention is not limited to a process for forming the ferroelectric memory cell on the semiconductor substrate. The present invention may be applied to a process for forming a ferroelectric memory cell on a semiconductor layer on an insulation substrate, such as SOI.

Further, a switching transistor for charge transfer of the present invention is not limited to a MOS transistor, which employs a gate insulating film composed of an oxide. An MIS transistor can also be used, wherein a gate insulting film is formed of a nitride, a nitride-oxide, or a laminated layer of oxides and nitrides.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor apparatus comprising the steps of:

forming, on a surface of a semiconductor substrate, an MIS transistor including a drian region and a source region each formed of an impurity diffusion region;

forming a first insulation film on said semiconductor sustrate having said MIS transistor formed thereon;

forming, in said first insulation film, first contact holes for exposing said drain region and said source region;

embedding, in said first contact holes by a CVD method, a bit line contact plug having a lower end which is in contact with one of said drain region and said source region of said MIS transistor and a capacitor cntact plug having a lower end which is in contact with other one of said drain region and said source region of said MIS transistor;

forming, above said first insulation film in which said bit line contact plug amd said capacitor contact plug are embedded, a ferroelectric capacitor having a lower eletrode, an interelctrode ferroelectric film and an upper elctrode;

forming, above said first insulation film having said ferroelectric capacitor formed thereabove, a second insulation film;

selectivity forming second contact holes in said second insulation film;

forming, on said second insulation film and in said second contact holes, a capacitor electric wire for establishing a connection between said upper electrode of said ferroelectric capacitor and a top end of said capacitor contact plug, and a bit line contact plug electric wire connected to a top surface of said bit line contact plug;

forming a third insulation film on said second insulation film including said capacitor electric wire and said bit line contact plug electric wire;

forming a via hole in a portion corresponding to a portion above said bit line contact plug eletric wire of said third insulation film; and reflowing at least one material selected from the group consisting of Al, AlCu, AlCuSi and Cu to embed said via hole therewith, for forming a bit line on said third insulation film and in said via hole and then patterning the material to form a bit line on said third insulation film, after the step of forming said ferroelectric capacitor.

2. A method of manufacturing a semiconductor apparatus according to claim 1, further comprising the step of depositing a fourth insulation film on said first insulation film between said step of embedding said capacitor contact plug and said step of forming said ferroelectric capacitor; and the step of forming, in said fourth insulation film, third contact holes for connecting said electric wire between the step of forming said ferroelectric capacitor and said step of forming said capacitor electric wire and said bit line capacitor contact plug electric wire.

3. A method of manufacturing a semiconductor apparatus according to claim 1, further comprising the step of sintering, using at least one of a hydrogen-based gas and a nitrogen-based gas between said step of embedding said capacitor contact plug and said step of forming said ferroelectric capacitor.

4. A method of manufacturing a semiconductor apparatus according to claim 1, wherein said step of forming said ferroelectric capacitor includes a step of depositing a fifth insulation film on said interelectrode ferroelectric film after said lower electrode film and said interelectrode ferroelectric film have been deposited, a step of selectively forming an opening portion in said fifth insulation film and a step of forming said upper electrode, after an electrode material for forming said upper electrode has been deposited in said opening portion and on said fifth insulation film, by removing said electrode material on said fifth insulation film.

5. A method of manufacturing a semiconductor apparatus comprising the steps of:

determining, on a surface portion of a semiconductor substrate, cell array region in which a plurality of MIS transistors each having a source region, a channel region and a drain region are disposed in rows and columns and in a checker pattern, said plural MIS transistors forming a plurality of pairs each of which is formed by adjacent two of said MIS transistors in a derection of said columns such that said drain region is shared;

forming a plurality of substantially parallel word lines in a direction of said rows on said sell array region, each of said plural word lines, through a gate insulation film, forming a gate electrode on said channel region of each of said plural MIS transistors on a corresponding one of said rows;

forming a first insulation film on said plural word lines and said semiconductor substrate;

sectively forming a plurality of first contact holes in said first isulation film;

embedding, in said first contact holes by a CVD method, a plurality of bit line contact plugs each having a lower end which is n contact with said region of each of said plural MIS transistors and a plurality of capacitor contact plugs each having a lower end which is in contact with said source region;

forming, above said first insultaion film, a plurality of capacitor plate lines to correspond to said plural word lines and to run substantially in parallel to said plural word lines;

forming, on said plural plate lines, a plurality of ferroelectric capacitors to correspond to said plural MIS transitors, said plural ferroelectric capacitors having lower electrodes composed of said plural plate lines, ferroelectric films formed on said lower electrodes and upper electrodes formed on said ferroelectric films, respectively;

forming a second insulation film on said first insulation film to cover said ferroelectric capacitors;

forming a plurality of second contact holes for connecting a capacitor electric wire in portions of said second insulation film each corresponding to a portion above said upper electrodes of said ferroelectric capacitors, a plurality of third contact holes in portions of said second insulation film corresponding to portions above said capacitor contact plugs, respectively, and a plurality of fourth contact holes in portion of said second insulation film corresponding to portions above said plural bit line contact plugs, respectively;

reflowing at least one material selected from the group consisting of Al, AlCu, AlCuSi and Cu to embed said second and said third contact holes therewith, to form capacitor electric wires each for establishing a connection between said upper electrode of said ferroelectric capacitor and a top surface of each of said capacitor contact plugs, accompanied by forming, through said fourth contact holes, a plurality of bit line connection electric wires to be connected to said bit line contact plugs, respectively;

forming a third insulation film above said semiconductor substrate after said capitator electric wires and said bit lines connection electric wires are formed;

forming, on said third insulation film, a plurality of bit lines which are respectivey in contact with said bit line connection electric wires and each commonly conncted to said plual MIS transistors on a corresponding one said columns in a direction in which said plural bit lines run substantially in parallel to one another and substantially perpendicular to said plural word lines.

6. A method of manufacturing a semiconductor apparatus comprising the steps of:

forming a first interlayer insulation film on a semiconductor substrate;

forming a first through hole in said first interlayer insulation film;

embedding said first through hole with a metal material by a CVD method;

forming a capacitor including a ferroelectric film having a perovskite structure or a layered perovskite stucture on said first interlayer insulating film above said semiconductor substrate, after said step of embedding said first through hole;

forming a multilayerd wiring structure including a lower wiring layer, an upper wiring layer and a second interlayer insulating layer interposed between said lower wiring layer and said upper wiring layer;

opening a second through hole in said second interlayer insulating layer; and reflowing at least one material selected from the group consisting of Al, AlCu, AlCuSi, and Cu to embed said second through hole therewith, after said step of forming said capacitor.

7. A method of manufacturing a semiconductor device according to claim 6, wherein said step of reflowing said at least one material includes a step of embedding said through hole with said at least one material to connect said lower wiring layer to said upper wiring layer.

8. A method of manufacturing a semiconductor device according to claim 1, wherein said step of forming a capacitor electric wire and a bit line contact plug electric wire includes a step of selectively forming any one of a W metal layer, a TiN metal layer and a Ti metal layer on an upper surface of said capacitor electric wire and said bit line contact plug electric wire.

9. A method of manufacturing a semiconductor device according to claim 2, wherein said step of seletively forming any one of a W metal layer, a TiN metal layer and a Ti metal layer includes a step of forming the same by a sputtering method.

10. A method of manufacturing a semiconductor device according to claim 5, wherein said step of reflowing at least one material to form capacitor electric wires and bit line connection electric wires includes a step of selectively forming any one of a W metal layer, a TiN metal layer and a Ti metal layer on each of upper surfaces of said capacitor electric and said bit line connection electric wires.

11. A method of manufacturing a semiconductor device according to claim 10, wherein said step of selectively forming any one of a W metal layer, a TiN metal layer and a Ti metal layer includes a step of forming the same by a sputtering method.

12. A method of manufacturing a semiconductor device according to claim 6, wherein said step of forming a multilayered wiring structure including a lower wiring layer includes a step of selectively forming any one of a W metal layer, a TiN metal layer and a Ti metal layer on an upper surface of said lower wiring layer.

13. A method of manufacturing a semiconductor device according to claim 12, wherein said step of selectively forming any one of a W metal layer, a TiN metal layer and a Ti metal layer includes a step of forming the same by a sputtering method.

* * * * *

UNITED STATES PATENT AND TRADEMARK OFFICE
CERTIFICATE OF CORRECTION

PATENT NO. : 6,190,957 B1
DATED : February 20, 2001
INVENTOR(S) : Hiroshi Mochizuki et al.

It is certified that error appears in the above-identified patent and that said Letters Patent is hereby corrected as shown below:

Title page,
Item [63] Related U.S. Application Data, please insert -- Division of application No. 08/889, 470, filed July 9, 1997, now Pat. No. 5, 990, 507 --.

Claim 1, column 39,
Line 35, "drian" has been replaced with -- drain --,
Line 51, "interelctrode" has been replaced with -- interelectrode --, Column 40,
Line 2, "eletric" has been replaced with -- electric --.

Claim 5, column 40,
Line 56, "sectively" has been replaced with -- selectively --,
Line 57, "isulation" has been replaced with -- insulation --,
Line 60, "n" has been replaced with -- in --,
Line 64, "insultaion" has been replaced with -- insulation --.

Claim 9, column 42,
Line 26, "2" has been replaced with -- 8 --.

Signed and Sealed this

Eleventh Day of December, 2001

*Attest:*

NICHOLAS P. GODICI
*Attesting Officer*    *Acting Director of the United States Patent and Trademark Office*